(12) United States Patent
Amano et al.

(10) Patent No.: US 11,876,066 B2
(45) Date of Patent: Jan. 16, 2024

(54) PALLADIUM-COATED COPPER BONDING WIRE, WIRE BONDING STRUCTURE, SEMICONDUCTOR DEVICE, AND MANUFACTURING METHOD OF SEMICONDUCTOR DEVICE

(71) Applicant: TANAKA DENSHI KOGYO K. K., Saga (JP)

(72) Inventors: Hiroyuki Amano, Saga (JP); Yuki Antoku, Saga (JP); Takeshi Kuwahara, Saga (JP); Tsukasa Ichikawa, Saga (JP)

(73) Assignee: TANAKA DENSHI KOGYO K.K., Saga (JP)

( * ) Notice: Subject to any disclaimer, the term of this patent is extended or adjusted under 35 U.S.C. 154(b) by 398 days.

(21) Appl. No.: 17/395,874

(22) Filed: Aug. 6, 2021

(65) Prior Publication Data
US 2021/0366867 A1  Nov. 25, 2021

Related U.S. Application Data

(63) Continuation of application No. PCT/JP2020/004483, filed on Feb. 6, 2020.

(30) Foreign Application Priority Data
Feb. 8, 2019 (JP) ................................. 2019-021837

(51) Int. Cl.
*H01L 23/00* (2006.01)
*H01L 23/495* (2006.01)

(52) U.S. Cl.
CPC .............. *H01L 24/45* (2013.01); *H01L 24/48* (2013.01); *H01L 23/49582* (2013.01);
(Continued)

(58) Field of Classification Search
None
See application file for complete search history.

(56) References Cited

U.S. PATENT DOCUMENTS

2010/0213619 A1  8/2010  Uno et al.
2010/0282495 A1  11/2010  Uno et al.
(Continued)

FOREIGN PATENT DOCUMENTS

CN  101802994 A  8/2010
CN  105023902 A  11/2015
(Continued)

OTHER PUBLICATIONS

CN, Office Action for Chinese application No. 202080012102.9, dated Feb. 28, 2022.
(Continued)

*Primary Examiner* — Nishath Yasmeen
(74) *Attorney, Agent, or Firm* — ORRICK, HERRINGTON & SUTCLIFFE LLP; Joseph A. Calvaruso; K. Patrick Herman

(57) ABSTRACT

The bonding wire being a Pd-coated copper bonding wire includes: a copper core material; and a Pd layer and containing a sulfur group element, in which with respect to the total of copper, Pd, and the sulfur group element, a concentration of Pd is 1.0 mass % to 4.0 mass % and a total concentration of the sulfur group element is 50 mass ppm or less, and a concentration of S is 5 mass ppm to 2 mass ppm, a concentration of Se is 5 mass ppm to 20 mass ppm, or a concentration of Te is 15 mass ppm to 50 mass ppm or less. A wire bonding structure includes a Pd-concentrated region with the concentration of Pd being 2.0 mass % or more relative to the total of Al, copper, and Pd near a bonding surface of an Al-containing electrode of a semiconductor chip and a ball bonding portion.

13 Claims, 5 Drawing Sheets

(52) U.S. Cl.
CPC .............. *H01L 24/05* (2013.01); *H01L 24/85* (2013.01); *H01L 2224/05624* (2013.01); *H01L 2224/05638* (2013.01); *H01L 2224/05647* (2013.01); *H01L 2224/45147* (2013.01); *H01L 2224/45565* (2013.01); *H01L 2224/45572* (2013.01); *H01L 2224/45601* (2013.01); *H01L 2224/45617* (2013.01); *H01L 2224/45644* (2013.01); *H01L 2224/45664* (2013.01); *H01L 2224/4852* (2013.01); *H01L 2224/48247* (2013.01); *H01L 2224/48465* (2013.01); *H01L 2224/48839* (2013.01); *H01L 2224/48844* (2013.01); *H01L 2224/85045* (2013.01); *H01L 2224/85181* (2013.01); *H01L 2224/85379* (2013.01); *H01L 2224/85395* (2013.01); *H01L 2224/85439* (2013.01); *H01L 2224/85444* (2013.01); *H01L 2924/01014* (2013.01); *H01L 2924/01016* (2013.01); *H01L 2924/01034* (2013.01); *H01L 2924/01052* (2013.01); *H01L 2924/10253* (2013.01); *H01L 2924/20104* (2013.01); *H01L 2924/20105* (2013.01); *H01L 2924/20751* (2013.01); *H01L 2924/20752* (2013.01)

(56) References Cited

U.S. PATENT DOCUMENTS

| | | | |
|---|---|---|---|
| 2012/0094121 A1* | 4/2012 | Uno | B23K 35/302 428/389 |
| 2012/0118610 A1 | 5/2012 | Terashima et al. | |
| 2013/0306352 A2 | 11/2013 | Terashima et al. | |
| 2017/0117244 A1* | 4/2017 | Yamada | C25D 5/10 |
| 2017/0125135 A1* | 5/2017 | Amano | H01L 24/11 |
| 2017/0323864 A1 | 11/2017 | Oda et al. | |
| 2018/0130763 A1 | 5/2018 | Yamada et al. | |
| 2020/0312808 A1 | 10/2020 | Oda et al. | |
| 2021/0280553 A1 | 9/2021 | Amano et al. | |

FOREIGN PATENT DOCUMENTS

| | | |
|---|---|---|
| CN | 105914195 A | 8/2016 |
| CN | 107041160 A | 8/2017 |
| CN | 113169077 A | 7/2021 |
| EP | 3147938 A | 3/2017 |
| JP | 2011-146754 A | 7/2011 |
| JP | 2012-156307 A | 8/2012 |
| JP | 2017-092078 A | 5/2017 |
| JP | 2018-078229 A | 5/2017 |
| JP | 2018-64050 A | 4/2018 |
| JP | 2018-137487 A | 8/2018 |
| TW | 201716592 A | 5/2017 |
| TW | 201802257 A | 1/2018 |
| TW | 201835343 A | 10/2018 |
| WO | WO 2016/189758 A1 | 12/2016 |

OTHER PUBLICATIONS

PCT, International Search Report for PCT/JP2020/004483, dated Mar. 3, 2020.

TW, Office Action for Taiwanese application No. 108104361, dated Oct. 28, 2021.

* cited by examiner

DEPTH DIRECTION ANALYSIS RESULT (EXAMPLE 14)

PALLADIUM-COATED COPPER BONDING WIRE, WIRE BONDING STRUCTURE, SEMICONDUCTOR DEVICE, AND MANUFACTURING METHOD OF SEMICONDUCTOR DEVICE

CROSS-REFERENCE TO RELATED APPLICATION

This application is a continuation of prior International Application No. PCT/JP2020/004483, filed on Feb. 6, 2020 which is based upon and claims the benefit of priority from Japanese Patent Application No. 2019-021837, filed on Feb. 8, 2019; the entire contents of all of which are incorporated herein by reference.

FIELD

The present invention relates to a palladium-coated copper bonding wire suitable for ball bonding of an electrode of a semiconductor element and an external electrode, a wire bonding structure using this, a semiconductor device having this wire bonding structure, and a manufacturing method of the semiconductor device.

BACKGROUND

In general, an electrode of a semiconductor element and an external electrode on a circuit wiring board for semiconductors are connected by wire bonding. In this wire bonding, the electrode of the semiconductor element and one end of a bonding wire are bonded by a method called ball bonding (first bonding), and the other end of the bonding wire and the external electrode are bonded by a method called wedge bonding (second bonding). In the ball bonding, a molten ball is formed at a tip of the bonding wire, and the bonding wire is connected to a surface of an aluminum electrode on the semiconductor element via the molten ball, for example.

When forming the molten ball, the tip of the bonding wire is first held vertically, an arc discharge is formed between the tip and a discharge torch using the Electronic Flame-Off (EFO) method, and by a discharge current, heat input is applied to the tip of the wire. By this heat input, the tip of the bonding wire is heated to melt. A molten metal rises through the wire due to its surface tension, and a spherical molten ball is formed at the tip of the wire to solidify, and thereby a free air ball (FAB) is formed. Then, the free air ball is crimped onto the electrode with ultrasonic waves being applied thereto while heating the electrode of the semiconductor element to about 140 to 300° C., and thereby one end of the bonding wire is bonded onto the aluminum electrode.

A gold wire with a diameter of 10 to 30 μm has been used for the wire bonding, but due to gold being very expensive, a copper wire has been used in a replaceable portion partly. However, the copper wire has a problem of being oxidized easily, so that a palladium-coated copper wire with a palladium-coated surface has come to be used to solve the oxidation problem.

However, the palladium-coated copper wire has an issue to achieve both the stability of bonding to the aluminum electrode and the loop stability because the surface of the ball is oxidized, for example. In response to this, for example, there has been proposed a palladium-coated copper wire containing sulfur in a copper core material (see, for example, Patent Document 1).

Although the palladium-coated copper wire suffers from the problem of oxidation of wires or free air balls inherent in copper itself, as well as the problem of improving the properties that tend to be impaired by coating, copper is less expensive than gold and thus has rapidly become popular for use under relatively moderate conditions in consumer devices such as personal computers, peripheral devices, and communications devices, and so on. Furthermore, in recent years, improvements of the palladium-coated copper wire have been in progress, and a shift of bonding wires, which are used under severe conditions, such as in devices for automobile use, to the palladium-coated copper wire has been in progress as well. As a result, the palladium-coated copper wire is required to be able to withstand extremely severe and rapidly changing conditions to be suitable for the devices for automobile use. Specifically, the palladium-coated copper wire is required to withstand a wide range of natural environments and their changes, from high-temperature and high-humidity regions such as the tropics and deserts to cold regions, and from mountainous regions to coastal regions, as well as to withstand shocks and vibrations caused by road and traffic conditions. In addition, in recent years, the application to semiconductor products to be installed in aircraft as well as in engine compartments of automobiles has come under consideration. As a result, there is a need for the palladium-coated copper bonding wire that meets the requirements of higher levels of reliability than ever before, which can withstand relatively moderate conditions of consumer applications as well as severe conditions.

In the process of developing the palladium-coated copper wire that meets such requirements for high reliability, attempts have been made to improve the bonding life by forming an alloy layer or concentrated layer with a high concentration of palladium on the surface of the free air ball (see, for example, Patent Documents 2, 3).

Further, the adjustment of a composition near a ball bonded portion has also been performed in order to improve the formability and bonding characteristic of a ball portion (see, for example, Patent Document 4).

SUMMARY

Although increasing the concentration of palladium of the surface of the free air ball has improved the bonding life as compared to a conventional wire (wire whose concentration of palladium of a surface of a free air ball is not increased) to be used in applications in relatively moderate conditions, it has been found out that the bonding life does not often extend as much when aiming for use in severe conditions.

The present inventors observed a large shrinkage cavity formed in the surface of the free air ball in such a palladium-coated copper wire whose bonding life did not extend, and thus presumed that this would be a factor inhibiting the extension of the bonding life. That is, they considered that when the free air ball having a shrinkage cavity was bonded onto the aluminum electrode, a void would be formed at the bonding interface, and this void served as a starting point for corrosion to progress, resulting in a decrease in the bonding life.

As a result of the intensive investigation into the cause of this problem, the present inventors concluded that some of the gold or silver plated on the surface of the external electrode adhered to an end portion of the wire that was torn off after the second bonding, and this gold or silver served as a starting point to form a shrinkage cavity in the free air ball.

Further, there has been a problem that even if they try to control the composition of a ball bonding portion made resulting from bonding the palladium-coated copper wire onto the electrode, stable control of the composition is extremely difficult.

The present invention has been made in order to solve the above-described problems, and an object thereof is to provide a palladium-coated copper bonding wire that does not cause a problematic large shrinkage cavity to be formed in a surface of a ball during ball formation and is capable of stably maintaining bonding reliability of ball bonding even in high-temperature and high-humidity environments and a wire bonding structure using this. Further, an object of the present invention is to provide a semiconductor device capable of stably maintaining bonding reliability even in high-temperature and high-humidity environments, particularly a semiconductor device suitable for packages of QFP (Quad Flat Packaging), BGA (Ball Grid Array), and QFN (Quad For Non-Lead Packaging) and usable for automotive applications, and a manufacturing method thereof.

The wire bonding structure of the present invention is a wire bonding structure including: an aluminum-containing electrode of a semiconductor chip; a bonding wire; and a ball bonding portion between the electrode and the ball bonding wire, in which the bonding wire is a palladium-coated copper bonding wire including: a core material containing copper as a main component; and a palladium layer on the core material and containing a sulfur group element, the palladium-coated copper bonding wire in which, with respect to a total of copper, palladium, and the sulfur group element, a concentration of palladium is 1.0 mass % or more and 4.0 mass % or less and a total concentration of the sulfur group element is 50 mass ppm or less, and a concentration of sulfur is 5 mass ppm or more and 12 mass ppm or less, a concentration of selenium is 5 mass ppm or more and 20 mass ppm or less, or a concentration of tellurium is 15 mass ppm or more and 50 mass ppm or less, and the wire bonding structure includes a palladium-concentrated bonding region with the concentration of palladium being 2.0 mass % or more with respect to a total of aluminum, copper, and palladium near a bonding surface of the electrode and the ball bonding portion.

In the bonding structure of the present invention, the palladium-concentrated bonding region is preferably present on lines parallel to a wire longitudinal direction, the lines each passing through a position at a distance of one-eighth of at least the maximum width of the ball bonding from each of both ends.

In the wire bonding structure of the present invention, an occupancy ratio of the palladium-concentrated bonding region near the bonding surface is preferably 25% or more.

The palladium-coated copper bonding wire of the present invention is a palladium-coated copper bonding wire including: a core material containing copper as a main component; and a palladium layer on the core material and containing a sulfur group element, the palladium-coated copper bonding wire in which, with respect to a total of copper, palladium, and the sulfur group element of the palladium-coated copper bonding wire, a concentration of palladium is 1.0 mass % or more and 4.0 mass % or less and a total concentration of the sulfur group element is 50 mass ppm or less, and a concentration of sulfur (S) is 5 mass ppm or more and 12 mass ppm or less, a concentration of selenium (Se) is 5 mass ppm or more and 20 mass ppm or less, or a concentration of tellurium (Te) is 15 mass ppm or more and 50 mass ppm or less, and when the palladium-coated copper bonding wire is ball bonded onto an aluminum electrode to fabricate a wire bonding structure, a palladium-concentrated bonding region with the concentration of palladium being 2.0 mass % or more with respect to a total of aluminum, palladium, and copper is formed near a bonding surface of the ball bonding on the aluminum electrode.

In the palladium-coated copper bonding wire of the present invention, an occupancy ratio of the palladium-concentrated bonding region near the bonding surface is preferably 25% or more.

In the wire bonding structure of the present invention, which is formed by using the palladium-coated copper bonding wire with the above-described configuration to form a free air ball and bonding the ball onto an aluminum-containing electrode of a semiconductor chip, the palladium-concentrated bonding region with the above-described specific composition is formed near the bonding surface of the ball bonding, and thus, it is possible to significantly improve the bonding reliability of first bonding (ball bonding). In other words, when being subjected to a bonding test in which the wire bonding structure is fabricated by the above-described ball bonding, the palladium-coated copper wire with the above-described configuration has the palladium-concentrated bonding region with the above-described specific composition formed near the bonding surface of the ball bonding, which makes it possible to significantly improve the bonding reliability of the first bonding (ball bonding).

The semiconductor device of the present invention is a semiconductor device including: a semiconductor chip; an aluminum-containing aluminum electrode provided on the semiconductor chip; a gold-coated or silver-coated external electrode provided outside the semiconductor chip; and a bonding wire connecting the aluminum electrode and a surface of the external electrode, in which the bonding wire is made of a palladium-coated copper wire and the semiconductor device includes the wire bonding structure of the present invention near a bonding surface of the aluminum electrode and the bonding wire.

The semiconductor device of the present invention is a semiconductor device including: a semiconductor chip; an aluminum-containing aluminum electrode provided on the semiconductor chip; a gold-coated or silver-coated external electrode provided outside the semiconductor chip; and a bonding wire connecting the aluminum electrode and a surface of the external electrode, in which the bonding wire is made of the above-described palladium-coated copper bonding wire of the present invention.

The semiconductor device of the present invention is preferably QFP (Quad Flat Packaging), BGA (Ball Grid Array), or QFN (Quad For Non-Lead Packaging). Further, the semiconductor device of the present invention is preferably for automotive applications.

The manufacturing method of the semiconductor device of the present invention is a manufacturing method of a semiconductor device including: a semiconductor chip; an aluminum-containing aluminum electrode provided on the semiconductor chip; a gold-coated or silver-coated external electrode provided outside the semiconductor chip; and a bonding wire connecting the aluminum electrode and a surface of the external electrode, in which the bonding wire is made of a palladium-coated copper bonding wire including: a core material containing copper as a main component; and a palladium layer on the core material and containing a sulfur group element, the palladium-coated copper bonding wire in which, with respect to a total of copper, palladium, and the sulfur group element of the palladium-coated copper bonding wire, a concentration of palladium is 1.0 mass % or more and 4.0 mass % or less and a total concentration of the sulfur group element is 5 mass ppm or more and 50 mass ppm or less, the manufacturing method including: forming a free air ball at a tip of the palladium-coated copper bonding wire and ball bonding the palladium-coated copper bonding wire to the aluminum electrode via the free air ball; and thereby, forming, near a bonding surface of the ball bonding on the electrode, a wire bonding structure including a palladium-concentrated bonding region with the concentration of palladium being 2.0 mass % or more relative to the total of copper, palladium, and the sulfur group element of the palladium-coated copper bonding wire a total of aluminum, copper, and palladium; and thereafter, second bonding a portion of the palladium-coated copper bonding wire apart from the free air ball by the length of the bonding wire to the surface of the external electrode.

In the manufacturing method of the semiconductor device of the present invention, an occupancy ratio of the palladium-concentrated bonding region near the bonding surface is preferably 25% or more.

In this description, the symbol "~" represents a numerical range including the numerical values on the left and right of the symbol. The sulfur group element is at least one type or more of sulfur (S), selenium (Se), and tellurium (Te).

EFFECT OF THE INVENTION

According to the palladium-coated copper bonding wire and the wire bonding structure of the present invention, when used for ball bonding, excellent bonding reliability can be maintained stably for a long period of time even in high-temperature and high-humidity environments without causing a problematic large shrinkage cavity to be formed in a surface of a ball during ball formation. Further, according to the semiconductor device and the manufacturing method thereof of the present invention, excellent bonding reliability can be maintained stably for a long period of time even in high-temperature and high-humidity environments.

DETAILED DESCRIPTION

Figure 1:
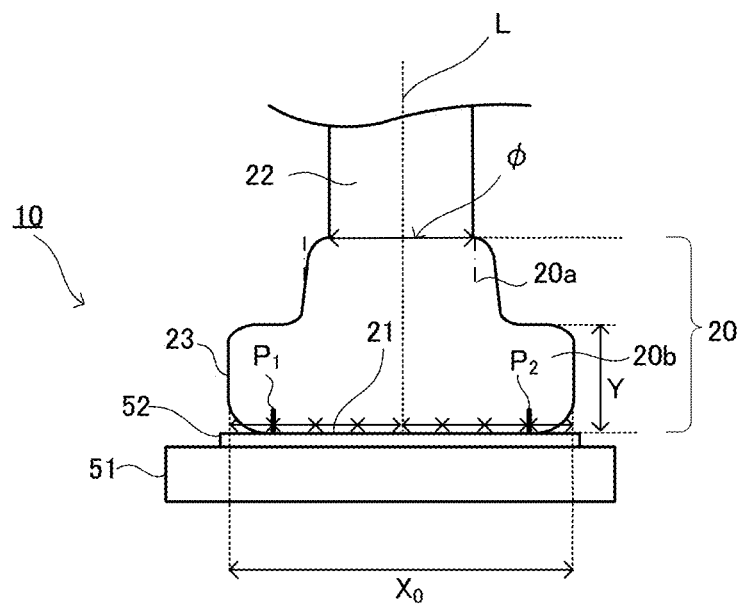
FIG. 1 is a view for explaining a place where a palladium-concentrated bonding region is formed.

There will be explained an embodiment of the present invention in detail below. FIG. 1 is a cross-sectional schematic view illustrating one example of a wire bonding structure 10 in this embodiment. The wire bonding structure 10 illustrated in FIG. 1 is formed by ball bonding a palladium-coated copper bonding wire to a surface of an aluminum-containing electrode 52 on a silicon (Si) substrate 51. FIG. 1 illustrates a cross section of this wire bonding structure 10, cut in a plane that is passing through a center line L in a wire longitudinal direction of the palladium-coated copper bonding wire and is parallel to the center line L. The wire bonding structure 10 includes a ball bonding portion 20, a bonding surface 21, and a wire portion 22 made of the above-described palladium-coated copper bonding wire. A wire diameter ϕ of the wire portion 22 is equal to that of the palladium-coated copper bonding wire.

The ball bonding portion 20 is formed of a first ball compressed portion 20a on its upper side and a second ball compressed portion 20b on its lower side. When ball bonding is to be performed, a free air ball formed at a tip of the palladium-coated copper bonding wire is pressure-bonded onto the electrode 52, and the first ball compressed portion 20a is a portion where the shape of the free air ball before ball bonding is relatively maintained and the second ball compressed portion 20b is a portion formed by the free air ball being crushed and deformed. Further, a surface 23 is a surface of the second ball compressed portion 20b. In the drawing, $X_0$ is the maximum width of the second ball compressed portion 20b in a direction parallel to the bonding surface 21 (a direction vertical to the center line L of the wire), and Y is the maximum height of the second ball compressed portion 20b from the bonding surface 21. $P_1$ and $P_2$ are line analysis portions, which are each passing through the outer point (point near each end) out of the points obtained by dividing the maximum width $X_0$ of the second ball compressed portion 20b in the direction parallel to the bonding surface 21 into equal eight parts and located in the direction vertical to the bonding surface 21 (direction parallel to the center line L of the wire). Incidentally, in the case where identification of the bonding surface 21 is difficult, it is acceptable even if as $X_0$, the maximum width of the second ball compressed portion 20b in the direction vertical to the center line L of the wire is measured because the equal value is obtained. As Y, the maximum height based on the contact point between the free air ball and the electrode 52 may be calculated. Incidentally, regarding the size, the direction, and the like of each portion of the ball bonding portion 20, the range of error in measurement, or the like is naturally allowed.

The wire bonding structure 10 in this embodiment includes a palladium-concentrated bonding region with the concentration of palladium being 2 mass % or more, preferably 5 mass % relative to the total of aluminum, copper, and palladium near the bonding surface 21 on the electrode 52.

In the wire bonding structure 10 in this embodiment, the palladium (Pd)-coated copper bonding wire, which forms the wire portion 22, includes a core material containing copper as a main component and a palladium layer on the core material. Then, the palladium-coated copper bonding wire contains a sulfur group element, in which with respect to the total of copper, palladium, and the sulfur group element, the concentration of palladium is 1.0 to 4.0 mass %, and when two or more sulfur group elements are contained, the total concentration of them is 50 mass ppm or less. The present inventors found out that following the adjustment of the concentration of palladium contained in the wire to the above-described concentration, the sulfur group element is contained in the palladium-coated copper bonding wire at a predetermined concentration, to thereby stably form the palladium-concentrated bonding region having the above-described composition, and having this palladium-concentrated bonding region makes it possible to maintain the bonding reliability of ball bonding for a long period of time, and completed the present invention.

In the wire bonding structure 10 in this embodiment, in the palladium-coated copper bonding wire forming the wire portion 22, the concentration of palladium derived from the copper core material is preferably 1.5 mass % or less relative to the total of copper, palladium, and the sulfur group element in the entire wire. When 1.5 mass % or less of palladium derived from the copper core material is contained, it becomes easier to obtain high reliability of first bonding without increasing a resistance value. When the palladium-coated copper bonding wire does not include another layer on the palladium layer and the copper core material contains palladium, the concentration of palladium in the entire wire is the sum of the concentration of palladium derived from the palladium layer and the concentration of palladium derived from the copper core material. When another layer is not provided on the palladium layer, the concentration of palladium derived from the palladium layer is preferably 1.0 to 2.5 mass % relative to the total of copper, palladium, and the sulfur group element in the entire wire. When the palladium-coated copper bonding wire in this embodiment includes another layer on the palladium layer, palladium coming into another layer from the palladium layer due to diffusion, or the like can also be used as palladium derived from the palladium layer to find the concentration of palladium.

In the wire bonding structure 10 in this embodiment, the palladium (Pd)-coated copper bonding wire forming the wire portion 22 has 1.0 mass % or more of the concentration of palladium and contains a predetermined amount of each of the sulfur group elements, thereby making it possible to enhance ball bonding reliability, resulting in that excellent ball bondability is maintained for a long period of time even under high-temperature and high-humidity. When the concentration of palladium is 4.0 mass % or less, in particular, the concentration of palladium derived from the palladium layer is 2.5 mass % or less, the occurrence of a shrinkage cavity in a free air ball (FAB) can be suppressed. As above, the concentration of palladium is 1.0 to 4.0 mass % and a predetermined amount of each of the sulfur group elements is contained, thereby making it possible to achieve both the high reliability of ball bonding and the suppression of occurrence of a shrinkage cavity during free air ball formation.

From the viewpoint of obtaining the high reliability of ball bonding, the concentration of palladium derived from the palladium layer is preferably 1.3 mass % or more. From the viewpoint of suppressing the occurrence of a shrinkage cavity, the concentration of palladium derived from the palladium layer is preferably 2.3 mass % or less.

The concentration of palladium derived from the palladium layer can be calculated by measuring the concentration of palladium in the entire wire and the concentration of palladium in the copper core material and using these. Specifically, the concentration can be analyzed by a secondary ion mass spectrometry (SIMS) analysis as follows. First, a wire to be measured is pressed and flattened. A SIMS spectrometer (for example, IMS-7f secondary ion mass spectrometer manufactured by CAMECA) is used to measure the concentration of palladium in a copper (Cu) core material of the flattened wire. A palladium layer of the surface of the above-described flattened wire is removed by sputtering in the above-described spectrometer to expose copper. To expose copper (Cu), for example, a wire with a diameter of 10 μm to 30 μm is sputtered for at least 0.5 μm or more in terms of palladium (Pd) from the surface to remove a palladium layer, and then is analyzed to a depth of 2.0 μm by starting the SIMS analysis. For example, 100 points or more are measured up to an analysis end point (2.0 μm in depth) from an analysis start point to calculate the average concentration of these 100 points. The analysis conditions are as follows: for example, primary ion species of $Cs^+$, a primary ion acceleration voltage of 15.0 keV, a primary ion irradiation region of about 30 μm×30 μm, and an analysis region of about 12 μm×12 μm as the setting conditions of the SIMS spectrometer. The SIMS analysis is performed in a manner that secondary ions released by sputtering while using the primary ions such as $Cs^+$ are detected with a mass spectrometer to be subjected to an elemental analysis, but the concentration of palladium can be found by converting a measured secondary ion intensity of palladium (Pd) to a concentration using a copper (Cu) wire whose concentration of palladium (Pd) has been already known as a standard sample.

The sulfur group elements are mainly contained in the palladium layer. However, the amount of the sulfur group elements is extremely small, and thus various analytical methods sometimes fail to accurately measure where the sulfur group elements are present and the concentration thereof in a configuration with an extremely thin palladium layer, in particular, currently. For this reason, the amount of the sulfur group elements is set to be in the above-described range as an amount relative to the entire palladium-coated copper bonding wire.

The palladium-concentrated bonding region can be evaluated as a predetermined range where a mass ratio of palladium relative to the total of palladium, copper, and aluminum is 2.0 mass % or more or preferably 5.0 mass % or more near a bonding surface where the free air ball comes into contact with the electrode to be bonded, namely a region where aluminum and palladium coexist. Specifically, when a predetermined place of the cross section of the above-described ball bonding portion 20 is line-analyzed by the field-emission scanning electron microscopy/energy dispersive X-ray spectrometry (FE-SEM/EDX) in a direction parallel to the center line of the wire from the ball bonding portion 20 side to the bonding surface 21, it is possible to evaluate as the palladium-concentrated bonding region, a predetermined range where the mass ratio of palladium relative to the total of palladium, copper, and aluminum is 2.0 mass % or more or preferably 5.0 mass % or more at each measurement point in the range where aluminum is greater than 0.5 mass % and 95.0 mass % or less. The reason why the measurement is performed in the range where the concentration of aluminum is greater than 0.5 mass % and 95.0 mass % or less is here because an analytical value of the place with no presence of aluminum is not 0 mass % due to effects of noise, and so on in analysis, or an analytical value of the place with the presence of only aluminum is not 100 mass % in some cases.

Having the palladium-concentrated bonding region with such a composition makes it possible to inhibit corrosion of the ball bonding portion, prevent breaks and separation, and improve bonding reliability. The electrode is formed, for example, by coating a surface of a silicon (Si) base material with an electrode material such as Al, AlSiCu (for example, Al—Cu (0.2 to 0.9 mass %)-Si (0.5 to 1.5 mass %)), or AlCu (for example, Al—Cu (0.2 to 0.9 mass %)). Further, the temperature of the electrode during ball bonding is 140 to 200° C., for example.

A higher concentration of palladium in the palladium-concentrated bonding region is better, and the concentration is 50.0 mass % or less, usually 30.0 mass % or less, or 20 mass % or less at each measurement point of the FE-SEM/EDX line analysis, for example.

Here, for example, in the above-described line analysis, for example, if the concentration profile of the FE-SEM/EDX analysis reveals that a wire having a diameter of 10 to 30 μm has 50 nm or more of a region with 2.0 mass % or more of the concentration of palladium in the case where the total of aluminum, palladium, and copper is set to 100 mass %, it is possible to evaluate that the palladium-concentrated bonding region is present.

The occupancy ratio of the palladium-concentrated bonding region within the bonding surface 21 can be calculated as follows as a ratio of the width of the palladium-concentrated bonding region in the direction of the bonding surface 21 in a cut surface to the maximum width of the ball bonding portion ($X_0$ illustrated in FIG. 1). After forming such a cut surface as illustrated in FIG. 1 by the same method as above, this cut surface is observed by a surface analysis with an electron probe microanalyzer (EPMA) (for example, an acceleration voltage of 15 kV, an irradiation current of 290 nA). In this observation image, a region where as the intensity of palladium (Pd), the concentration of palladium is more highly detected than a region with the concentration of 2.0 mass % or more relative to the total of aluminum, copper, and palladium is considered to reflect the palladium-concentrated bonding region, and $X_1$, which is the total of the widths of the regions with the high intensity, is measured. This width $X_1$ is measured as the width in the direction vertical to the center line L of the wire. The maximum width $X_0$ of the second ball compressed portion 20b in the cut surface and the total of the widths of the ranges with the detected palladium-concentrated bonding region (the total width $X_1$) are measured, and the occupancy ratio is calculated as $(X_1/X_0) \times 100(\%)$. Incidentally, regarding curved portions of the second ball compressed portion 20b that are not directly bonded to the electrode on the electrode side (lower side in FIG. 1), the occupancy ratio of the palladium-concentrated bonding region can be calculated by measuring the width obtained by projecting the curved portions on the maximum width $X_0$.

Forming the palladium-concentrated bonding region in the embodiment makes it possible to inhibit corrosion of the ball bonding portion, prevent breaks and separation of the ball bonding portion caused by long-term use, and improve bonding reliability. Further, the palladium-coated copper bonding wire contains each of the sulfur group elements at the above-described predetermined concentrations, which enables stable formation of the palladium-concentrated bonding region even under any conditions within the range of such ball bonding conditions as will be described later. Therefore, the effect of improving the bonding reliability is remarkable as compared to the conventional one, where, for example, manipulation of the ball forming conditions enables the achievement of the concentration of palladium as described above in the ball bonding portion.

Further, the occupancy ratio of the palladium-concentrated bonding region with the above-described composition that is near the bonding surface 21 of the electrode and the free air ball in the wire bonding structure is preferably 25% or more. This makes it possible to maintain excellent high reliability. The occupancy ratio of the palladium-concentrated bonding region within the bonding surface is preferably 50% or more and further preferably 75% or more.

A method of analyzing the palladium-concentrated bonding region is explained in detail using, as an example, the case where a pure aluminum electrode is employed as a bonding target. The same is applied to the case of using electrodes containing aluminum and elements other than aluminum. The palladium-coated copper bonding wire is used to form a free air ball, and the ball is bonded onto the aluminum electrode. The ball bonding portion is cut so as to make a surface parallel to the center line L in the wire longitudinal direction exposed. Thereby, such a cut surface as illustrated in FIG. 1 is obtained. The cut surface is subjected to a line analysis from a predetermined point on the wire side in a direction substantially vertical to the bonding surface 21 (depth direction). As the line analysis, the above-described FE-SEM/EDX is suitable. Incidentally, the cut surface for such an analysis includes the center line L in the wire longitudinal direction as illustrated in FIG. 1, or is formed to be as close as possible to the center line L preferably.

The cut surface of the ball bonding portion can be fabricated as follows. As a lead frame, for example, a PBGA32PIN frame is used, and a substantially square-shaped semiconductor chip is bonded to a center portion of this frame. An aluminum electrode on the semiconductor chip and an external electrode on the frame are wire bonded by the palladium-coated copper bonding wire, and a measurement sample is fabricated. The palladium-coated copper bonding wire is ball bonded (first bonded) to the aluminum electrode on the semiconductor chip and is wedge bonded (second bonded) to the lead frame. Normally, a chip has many electrodes arranged in multiple rows, and thus, bonding wires are bonded to, for example, (eight) electrodes of one of the rows at equal intervals, and bonding wires are bonded also to the other three rows (three sides) in the same manner. Bonding wires are ball bonded to 32 aluminum electrodes in total. Including the wedge bonding to the lead frame, 32 sets of wire bonding in total are made.

Regarding the forming condition of the free air ball, in the case where the diameter of the palladium-coated copper bonding wire is 10 to 30 μm, for example, arc discharge conditions are set so that a discharge current value becomes 30 to 90 mA and the diameter of the free air ball becomes 1.5 to 2.3 times the diameter of the wire. For a bonder apparatus, a commercially available product such as a bonder apparatus (IConn ProCu PLUS) manufactured by KANDS Co., Ltd., for example, can be used. When using such a bonder apparatus, the apparatus is preferably set that a discharge time is 50 to 1000 μs, an EFO-Gap is 25 to 45 mil (about 635 to 1143 μm), and a tail length is 6 to 12 mil (about 152 to 305 μm). When another bonder apparatus other than this bonder apparatus is used, its conditions only need to be the same as above, which are, for example, the condition under which the diameter of the free air ball becomes the same size as above. Further, in order to make a mixed gas atmosphere of nitrogen and hydrogen or a nitrogen gas atmosphere for a tip portion of the wire, the above-described gas is sprayed at a gas flow rate of 0.2 to 0.8 L/min and preferably 0.3 to 0.6 L/min. The gas when forming the free air ball is preferred to be a mixed gas of 95.0 vol % of nitrogen and 5.0 vol % of hydrogen, and the diameter of the free air ball may be within the above-described range as the target value.

Further, in the case of a wire with a diameter φ of 18 μm having had a free air ball with a diameter of 33 μm formed thereon, for example, the ball bonding conditions (first bonding conditions) can be adjusted in the bonder apparatus so as to obtain about 10 μm of the height Y of the second ball compressed portion 20b and obtain about 40 μm of the maximum width $X_0$ in the direction substantially parallel to the bonding surface 21 of the second ball compressed portion 20b. Specifically, the settings of the bonder apparatus include a ball crimping force of 7.5 gf, an ultrasonic application output of 70 mA, a ball crimping time of 15 ms, a crimping temperature of 150° C., and so on. Further, the second bonding conditions are, for example, a crimping force of 70 gf, a crimping time of 20 ms, a crimping temperature of 150° C., a frequency of 200 kHz, an amplitude of 3.0 μm, and 2 cycles in a scrubbing mode. Incidentally, bonding can be performed to have 2.0 mm of a loop length from a first bonding portion to a second bonding portion.

Next, the semiconductor chip containing a total of 32 sets of bonding portions formed as described above is molded in a molding machine using an encapsulating resin. After a mold has hardened, a molded part is cut from the frame, and further, the vicinity of one row (one side) of the ball bonding portions in the molded part is cut. The cut mold is placed in a cylindrical mold in a direction in which a cross section of the ball bonding portion (such a cross section as illustrated in FIG. 1) can be polished, and an embedding resin is poured thereinto to be cured with a curing agent added thereto. Thereafter, the cured cylindrical resin containing the semiconductor chip is roughly polished by an abrader so as to make the vicinity of the center of the ball bonding portion exposed as much as possible. After the resin being polished almost up to the vicinity of the cross section of the center of the ball bonding portion, a fine adjustment is made by an ion milling apparatus so as to make a surface that is finally polish finished and includes a ball center portion (a surface passing through the center line L of the wire portion and parallel to the center line L) just exposed to be at the position of an analytical surface. When the width of the wire of the cross section of the wire portion becomes the length of the diameter of the wire, it is an indication that the cut surface results in the surface including the ball center portion. The cut surface is set as a surface to be analyzed and a desired place thereof is line-analyzed from the ball side toward the electrode side by the field-emission scanning electron microscopy/energy dispersive X-ray spectrometry (FE-SEM/EDX). The line analysis conditions are, for example, an acceleration voltage of 6 keV, a measurement region ϕ of 0.18 μm, and a measurement interval of 0.02 μm.

It is common in an EPMA measurement (surface analysis), for example, that the presence ratio of elements to be measured is usually measured as the intensities of X rays emitted from the elements when the elements to be measured are irradiated with an electron beam, and the intensities are displayed in color mapping reflecting the colors on an EPMA image. In other words, points with no presence of the elements to be measured are displayed in pitch black, and the elements are displayed in a gradation such as "white, red, yellow, green, blue, and black" as an example, in order of increasing probability of their presence. If the concentration of palladium is 2.0 mass % or more at the point with the lowest intensity of palladium, namely, at the darkest point (point that is blue close to black) among the points where the intensity of palladium is observed, which are not pitch black, on such an EPMA image in the vicinity of the bonding surface 21 of the EPMA image, the regions to be displayed other than the above, which are displayed in a color more intense than that of the above points, can be identified as the palladium-concentrated bonding region. Further, the results of the line analysis and the EPMA image (surface analysis) are overlaid to determine visually whether to set the points where 2.0 mass % or more of the concentration of palladium is observed in the line analysis and the intensity is equal to or more than that of the measurement point on the EPMA to be identified as the intensity difference (color on the image). Thereby, the presence or absence and the occupancy ratio of the palladium-concentrated bonding region can be calculated. Incidentally, when calculating the occupancy ratio of the palladium-concentrated bonding region, the EPMA color mapping image is used, but the more the image is enlarged, the more "sparse" the palladium-concentrated bonding region may appear to be, so that the occupancy ratio is preferably calculated at a magnification that allows at least the second ball compressed portion of the ball to fit into a single image.

Further, the effect obtained by having the palladium-concentrated bonding region within the bonding surface 21 can be evaluated by a concentration analysis in the above-described line analysis portions ($P_1$, $P_2$). That is, as described above, in FIG. 1, two straight lines in the direction vertical to the bonding surface 21, which are passing through the outer points (points each near the end) out of the points obtained by dividing the maximum width $X_0$ of the second ball compressed portion 20b in the direction substantially parallel to the bonding surface into eight equal points, are set as the line analysis portions $P_1$, $P_2$, and the line analysis portions $P_1$, $P_2$ are each line-analyzed from the ball side toward the electrode side by the FE-SEM/EDX similarly to the above. At this time, if the palladium-concentrated bonding region with the concentration of palladium being 2 mass % or more relative to the total of aluminum, copper, and palladium is detected in each of the line analysis portions $P_1$ and $P_2$, the palladium-concentrated bonding region can be considered to be present near the bonding surface 21, which makes it possible to evaluate that the bonding reliability is maintained over a long period of time. Halogen elements and moisture from the encapsulating resin, and so on are highly likely to penetrate through small gaps or the like at both ends near the ball bonding surface, namely, in the vicinity closest to the bonding portion of the ball and the electrode, and thus the presence of the palladium-concentrated bonding region with high corrosion resistance near the both ends plays a very important role in preventing the penetration of halogens and other substances.

In the palladium-coated copper bonding wire, a palladium-concentrated region containing 6.5 to 30.0 atom % of palladium on average relative to the total of copper and palladium is preferably observed in a range from a surface of a tip portion of a free air ball (approximately a tip portion of a free air ball on the side opposite to a wire neck portion), which is formed using the palladium-coated copper bonding wire, to 5.0 nm or more and 100.0 nm or less in a depth direction.

Having such a palladium-concentrated region makes it possible to presume that the palladium-concentrated region, which is rich in palladium, is formed in layers in the entire vicinity of the surface of the ball or in a partial range including the tip portion. The palladium contained in the palladium-concentrated region may be derived from the core material, the palladium layer, or both. By the formation of such a palladium-concentrated region, excellent effects of improving the bonding reliability of the ball bonding and enabling suppression of the occurrence of a shrinkage cavity in the free air ball simultaneously are obtained. Specifically, according to the palladium-coated copper bonding wire in this embodiment, excellent bonding reliability can be maintained for a long period of time even in high-temperature and high-humidity environments. The concentration of palladium of the palladium-concentrated region is preferably 7.0~25.0 atom %, and when the concentration is in this range, chip damage can be further suppressed to improve the yield of a semiconductor device. The palladium-concentrated region can be observed by an Auger (FE-AES) analysis, as will be described later.

In the palladium-coated copper bonding wire in this embodiment, typically, the above-described specific amount of the sulfur group elements is contained in the palladium layer, and thereby the palladium-concentrated region can be formed.

When the palladium-coated copper bonding wire in this embodiment is used to form a free air ball, most of the palladium remains near the surface without being diffusively absorbed into the inside of the ball during ball melting. The palladium remaining near the surface forms the palladium-concentrated region on the surface of the solidified ball. Therefore, the palladium-concentrated region has the above-described composition as traces of the palladium remaining near the surface of the free air ball before solidification. When bonding to an aluminum electrode, the presence of the palladium-concentrated region at the place where the free air ball and the electrode are bonded can improve the bonding reliability of the ball bonding (first bonding).

According to the palladium-coated copper bonding wire in this embodiment, which is configured to form the palladium-concentrated region having a predetermined composition in the embodiment as traces of the palladium remaining on the surface of the free air ball as described above, it is possible to prevent a shrinkage cavity during free air ball formation. Further, ball bonding is performed on the electrode of aluminum or the like via the free air ball having such a palladium-concentrated region as above, thereby making it possible to extremely improve the ball bonding reliability.

The free air ball is formed under the following conditions, for example, as described above. When the diameter of the palladium-coated copper bonding wire is 10 to 30 μm, preferably 15 to 25 μm, and more preferably 18 to 20 μm, arc discharge conditions are set so that a discharge current value becomes 30 to 90 mA and the diameter of the free air ball becomes 1.5 to 2.3 times the diameter of the wire. For a bonder apparatus, a commercially available product such as a bonder apparatus (IConn ProCu PLUS) manufactured by KANDS Co., Ltd., for example, can be used. When using such a bonder apparatus, the apparatus is preferably set that a discharge time is 50 to 1000 μs, an EFO-Gap is 25 to 45 mil (about 635 to 1143 μm), and a tail length is 6 to 12 mil (about 152 to 305 μm). When another bonder apparatus other than this bonder apparatus is used, the setting conditions of the apparatus only need to be adjusted according to a target ball diameter to obtain the same ball diameter as above. Further, in order to make a mixed gas atmosphere of nitrogen and hydrogen or a nitrogen gas atmosphere for the tip portion of the wire, the above-described gas is sprayed at a gas flow rate of, for example, 0.2 to 0.8 L/min, preferably 0.3 to 0.6 L/min, and more preferably 0.5 L/min. The gas during the free air ball formation is preferred to be a mixed gas of 95.0 vol % of nitrogen and 5.0 vol % of hydrogen, and the diameter of the free air ball is preferably made to fall within the above-described range as the target value.

Therefore, when observing whether or not the palladium-concentrated region is formed in a predetermined wire, the above-described concentrated region may be measured using a free air ball formed in the presence of a mixed gas of nitrogen and hydrogen, with the discharge current value of 65 mA and the diameter of the ball of 1.8±0.3 times the diameter of the wire in the above-described range representatively. The ball diameter is a target value or an actual measured value, but is preferred to be the actual measured value.

The typical measurement conditions in the case of measuring the palladium-concentrated region by the FE-AES analysis are as follows: in wires with a diameter of 10 to 30 μm, preferably 15 to 25 μm, and more preferably 18 to 20 μm, the FE-AES electron spectrometer is used to analyze a tip portion of a free air ball from the surface to 100.0 nm in the depth direction. The measurement conditions at this time are as follows: for example, an acceleration voltage of a primary electron beam of 10 kV, a current of 50 nA or less (preferably 50 nA), an acceleration voltage of argon ion sputtering of 1 kV, and a sputtering rate of 2.5 nm/min (in terms of $SiO_2$) as the settings of the FE-AES electron spectrometer. The area of a measurement region calculated from a set value is 15 $\mu m^2$ or more and 20 $\mu m^2$ or less, and is set to a substantially circular shape or a substantially square shape, for example. Specifically, as the measurement region, a substantially circular shape having a diameter of 5 μm or a substantially square shape of 4 μm×4 μm can be used. Incidentally, an analysis region, which is a set value, is preferably a region that has the above-described area and has a smaller outer peripheral length, for example, a square or a circle. More specifically, a more appropriate analysis is possible by adjusting the maximum distance from the center of gravity of a plane figure formed by at least an outer peripheral line of the analysis region to the outer peripheral line to be 3 μm or less. In order to improve the analytical accuracy, the Auger analysis is performed at nine or more points at even intervals in the depth direction, and an average value of the analysis is calculated. Further, the measurement region can be evaluated as a region assuming that the beam is emitted vertically to a predetermined plane, without considering the inclination of the sample.

The palladium-concentrated region can be measured as a region with 6.5 to 30.0 atom % on average of palladium relative to the total of copper and palladium in the FE-AES profile from the surface to 5.0 to 100.0 nm in depth. At this time, depending on the measurement point, the region with 6.5 to 30.0 atom % of palladium may be discontinuous, but in such a case, a range including all the regions with 6.5 to 30.0 atom % of palladium can be identified as the palladium-concentrated region. Incidentally, the FE-AES profile may contain noise due to extraneous matters or the like, and thus the measurement is performed from the point where the depth from the surface is 5.0 nm toward the center.

It is normal that in the case of using the palladium-coated copper bonding wire in the above-described embodiment, the concentration of palladium of the palladium-concentrated region of the free air ball is substantially constant in the depth direction from the surface, or the palladium-concentrated region is formed so that the concentration of palladium decreases gradually. Therefore, as the palladium-concentrated region, a range of 5 nm or more and 300 nm or less is preferable, and a range of 400 nm or less is more preferable. That is, a palladium-concentrated region having the above-described specific concentration as the average concentration of palladium, which is within the preferred thickness range from the surface, is preferably observed. This is because the thicker the palladium-concentrated region, the easier it is to obtain the effect of improving bonding reliability. On the other hand, the thickness of the palladium-concentrated region is thought to be about 1.5 μm or less and preferably suppressed to 1.0 μm or less, when the diameter of the wire is 10 to 30 μm, because the concentration of palladium in the entire wire is the above-described specific concentration. Since the palladium-concentrated region is suppressed to the above-described thickness, it is less likely to damage a semiconductor chip.

Next, there is explained a configuration of the palladium-coated copper bonding wire in this embodiment. The core material in the palladium-coated copper bonding wire in this embodiment is copper or a copper alloy made of copper as a main component. The main component here means that the component is central in quantity or properties, and the content is at least 50.0 mass %. The properties as the main component are properties required for the configuration, which are, for example, mechanical properties such as a wire breaking force and an elongation percentage in the case of the copper core material. The main component can be said to be, for example, a component that centrally affects such properties.

In addition to copper (Cu), the copper core material may also contain trace elements such as inevitable impurities and additive elements. The additive elements are elements to be added in trace amounts for purpose of improving properties such as oxidation resistance and toughness of the palladium-coated copper bonding wire, and the like generally. Such trace elements are, for example, P, Au, Pd, Pt, Ni, Ag, Rh, In, Ga, Fe, and so on. The ratio of the trace elements in the copper core material is preferably 3.0 mass % or less and more preferably 1.5 mass % or less. When the concentration of the trace elements in the copper core material exceeds 3.0 mass %, wire drawability may deteriorate, a specific resistance may increase, or chip damage may occur during ball bonding.

The content ratios of the trace elements in the copper and the elements to be contained in the wire are generally measured by a chemical analysis such as an inductively coupled plasma (ICP) emission spectrochemical analysis, but the measurement is not limited thereto. For example, when a metallic element of the same type as a coating layer is contained in the copper core material, the content ratio of the metallic element can be measured by the SIMS analysis in the same manner as the palladium in the above-described copper core material.

The palladium layer can be analyzed as a region ranging from where the ratio of palladium is 50.0 atom % relative to the total of copper and palladium to the surface of the palladium layer in the Auger (FE-AES) analysis profile in the depth direction from the surface of the wire. Where the ratio of palladium is 50.0 atom % is the boundary between the copper core material and the palladium layer. In the case where the palladium layer is so thin that it is difficult to clearly measure the thickness of the palladium layer or the existing ratio of palladium in a specific place even by the FE-AES analysis, the FE-AES analysis may be further combined with an analysis by scanning transmission electron microscopy/energy dispersive X-ray spectrometry (TEM/EDX), an analysis by spherical aberration-corrected scanning transmission electron microscopy/energy dispersive X-ray spectrometry (STEM/EDX), an atomic number contrast image (HAADF image), or the like appropriately.

The thickness of the palladium layer is preferably, depending on the diameter of the palladium-coated copper bonding wire, 0.020 μm or more and 0.150 μm or less, and more preferably 0.030 μm or more and 0.130 μm or less when the diameter of the wire is 10 μm to 30 μm. This is because when the thickness of the palladium layer is uniform within the above-described range, leaning resistance when the bonding wire is bonded and the quality of loop characteristics such as stability of a loop height are improved. As a method of measuring the thickness of the palladium layer, the above-described FE-AES analysis can be used, and as described above, in order to improve the measurement accuracy, the analysis by TEM/EDX, the analysis by STEM/EDX, the HAADF image, or the like may be used in combination appropriately.

The palladium-coated copper bonding wire in this embodiment contains the sulfur group element (one or more of sulfur, selenium, and tellurium), and when containing two or more of the sulfur group elements, the total concentration of the sulfur group elements in the entire wire is 50 mass ppm or less. The total concentration of the sulfur group element in the entire wire is preferably 5 mass ppm or more, which makes it easy to obtain ball bonding reliability. From the viewpoint of ball bonding reliability, the total concentration of the sulfur group element in the entire wire is preferably 6 mass ppm or more. Further, when the concentration of the sulfur group element exceeds 50 mass ppm, the palladium layer becomes brittle, cracks occur in the palladium layer during wire drawing, and the cracks cause the wire to break, resulting in poor wire drawability. In order to improve the wire drawability, the concentration of the sulfur group element is preferably 45 mass ppm or less and more preferably 41 mass ppm or less.

In the palladium-coated copper bonding wire in this embodiment, among the above-described sulfur group elements, the concentration of sulfur (S) is 5 mass ppm or more in the entire wire, and preferably 6 mass ppm or more. The concentration of sulfur (S) is 5 mass ppm or more, which makes it possible to enhance the ball bonding reliability. On the other hand, the concentration of sulfur (S) is 12 mass ppm or less in the entire wire, and when the concentration exceeds this, the palladium layer becomes brittle, cracks occur in the palladium layer, and the cracks cause the wire to break, resulting in poor wire drawability. The concentration of sulfur (S) is preferably 10 mass ppm or less in the entire wire.

Further, the concentration of selenium (Se) is 5 mass ppm or more in the entire wire, preferably 6 mass ppm or more, and more preferably 8 mass ppm or more. The concentration of selenium (Se) is 5 mass ppm or more, which makes it possible to enhance the ball bonding reliability. On the other hand, the concentration of selenium (Se) is 20 mass ppm or less in the entire wire, and when the concentration exceeds this, the palladium layer becomes brittle, cracks occur in the palladium layer, and the cracks cause the wire to break, resulting in poor wire drawability. The concentration of selenium (Se) is preferably 15 mass ppm or less in the entire wire.

Further, the concentration of tellurium (Te) is 15 mass ppm or more in the entire wire, and more preferably 16 mass ppm or more. The concentration of tellurium (Te) is 15 mass ppm or more, which makes it possible to enhance the ball bonding reliability. On the other hand, the concentration of tellurium (Te) is 50 mass ppm or less in the entire wire, and when the concentration exceeds this, the palladium layer becomes brittle, cracks occur in the palladium layer, and the cracks cause the wire to break, resulting in poor wire drawability. The concentration of tellurium (Te) is preferably 45 mass ppm or less in the entire wire, and more preferably 41 mass ppm or less.

The palladium-coated copper bonding wire in this embodiment may contain only one of the sulfur group elements or two or more of them, as long as the total concentration of the sulfur group element is within a range of 50 mass ppm or less and one of sulfur, selenium, and tellurium satisfies the above-described concentration range. The palladium-coated copper bonding wire contains each of the sulfur group elements at the above-described concentrations as above, thereby making it easy to stably form the above-described palladium-concentrated bonding region in the ball bonding portion regardless of the ball forming conditions, resulting in that the bonding reliability is improved significantly.

The palladium-coated copper bonding wire in this embodiment may include a second layer made of metal other than palladium on the palladium layer. The metal of the second layer may be a pure metal, or an alloy of two or more metals mixed together. When the palladium-coated copper bonding wire includes the second layer on the palladium layer, the boundary between the palladium layer and the second layer can be measured as a portion where the concentration of the main component metal in the second layer is 50.0% relative to the maximum concentration. In the case of including a third layer and a fourth layer on the surface of the second layer, the analysis can be performed according to the above.

The palladium-coated copper bonding wire in this embodiment preferably includes a gold layer in the outermost layer as a layer other than the palladium layer. The palladium-coated copper wire in this embodiment includes the gold layer, thereby making it possible to improve bondability of the second bonding and reduce die wear during wire drawing simultaneously. The gold layer is a layer formed of gold as its main component. The gold layer may be partially interrupted as long as it is formed over the surface of the palladium layer, and palladium may be contained in the gold layer. When palladium is contained in the gold layer, the concentration of palladium may be uniform in the thickness direction or may have a concentration gradient that decays toward the surface. Further, when the gold layer is formed of an alloy of two or more metals mixed together, the gold layer may contain silver, copper, and so on in addition to palladium and gold unless the effect of the present invention is impaired. In this case, the amount of metal elements other than palladium in the gold layer is, for example, less than 50.0 mass %.

When the palladium-coated copper bonding wire in this embodiment includes the gold layer, the concentration of gold derived from this gold layer in the entire wire is preferably 0.01 mass % or more and more preferably 0.05 mass % or more. When the concentration of gold derived from the gold layer is 0.01 mass % or more, the second bondability tends to improve and the die wear during wire drawing is reduced easily. The concentration of gold derived from the gold layer in the entire wire is preferably 0.20 mass % or less and more preferably 0.15 mass % or less. When the concentration of gold derived from the gold layer is 0.20 mass % or less, it is less likely to adversely affect the wire performance and less likely to impair the sphericity of the free air ball. Incidentally, when the copper core material contains gold, the concentration of gold in the entire wire is the sum of the concentration of gold derived from the above-described gold layer and the concentration of gold in the copper core material. Therefore, when measuring the concentration of gold derived from the gold layer, the concentration of gold in the entire wire and the concentration of gold in the copper core material can be measured individually, to calculate the concentration of gold derived from the gold layer using these concentrations. The concentration of gold derived from the gold layer can be measured by the SIMS analysis specifically in the same manner as the concentration of palladium derived from the above-described palladium layer.

The thickness of the gold layer is preferably, depending on the diameter of the palladium-coated copper bonding wire, 8 nm or less and more preferably 5 nm or less. When the thickness of the gold layer is 8 nm or less, it is easy to maintain high reliability of the ball bonding without impairing the sphericity of the free air ball even with the gold layer. The lower limit of the thickness of the gold layer is not particularly limited, but it is sufficient as long as a later-described concentration-converted average film thickness is 1 nm or more. As a method of measuring the thickness of the gold layer, the FE-AES analysis can be used as in the case of the palladium layer.

Incidentally, the thickness of the gold layer becomes significantly thin when the concentration of gold in the entire wire is in the above-described preferred range. When the thickness of the gold layer becomes significantly thin as above, it is currently difficult to accurately measure the thickness of the gold layer by using general measurement methods. Therefore, when the thickness of the gold layer becomes significantly thin, the thickness of the gold layer can be evaluated by the concentration-converted average film thickness, which is calculated using the concentration of gold in the entire wire and the diameter of the wire. Examples of a method of obtaining this concentration-converted average film thickness include: a method of calculating the mass of gold per unit length based on the concentration of gold and the specific gravity of gold, and then finding the film thickness assuming that the wire cross section is a perfect circle and gold is uniformly present on the uppermost surface; and a method of performing a proportional calculation using a thickness of a gold coating at a plated wire diameter, (which may be a design value), and a final wire diameter.

Here, the reason why the configuration in the above-described embodiment enables achievement of both the ball bonding reliability and the suppression of occurrence of a shrinkage cavity is assumed as follows, as an example. In the ball bonding, an arc discharge is formed between a discharge torch and a tip of a wire, and by the heat from an arc current, the tip of a ball melts and a free air ball is formed. At this time, in a conventional palladium-coated copper wire, where the concentration of palladium in the ball bonding portion does not increase, palladium on the outer side of the wire is diffusively absorbed into the inside of the molten ball during the process of forming a free air ball from the metal of the wire molten by the arc heat input and the additive elements. When such a conventional wire is ball bonded onto an aluminum-containing electrode, a copper-aluminum intermetallic compound, such as, for example, $Cu_9Al_4$, is easily corroded at the bonding interface between the aluminum-containing electrode and a ball bonding portion because the vicinity of a bonding surface does not become rich in palladium.

In semiconductor products, it is normal that the entire wire bonding is encapsulated in resin or the like. Halogen elements such as chlorine and bromine derived from this encapsulating resin, as well as moisture, sulfur, and so on from the atmosphere, enter the ball bonding interface to corrode the copper-aluminum intermetallic compound at the ball bonding interface, which has been problematic. Then, the higher the temperature and humidity of the atmosphere of the semiconductor element, the greater the corrosion tends to be. As the corrosion at the ball bonding interface progresses, separation and breaks occur at the ball bonding interface to cause an increase in electrical resistance, resulting in a problem of poor current flow.

In contrast to this, it is thought that in the wire having the specific composition and configuration in this embodiment, the diffusion and absorption of palladium into the inside of the molten ball is suppressed during the process of forming the free air ball, and the unabsorbed palladium is concentrated and distributed near the surface of the ball to cover the surface of the ball. When the ball is bonded onto the aluminum-containing electrode with this unabsorbed palladium covering the surface of the free air ball, the bonding interface becomes rich in palladium, which has strong corrosion resistance. Therefore, it is presumed that the formation of the copper-aluminum intermetallic compound is suppressed, and further the corrosion caused by halogen (chlorine in particular), sulfur, water, and so on coming from the outside is also suppressed. As a result, the ball bonding reliability improves, thereby making it possible to significantly improve the reliability under the high-temperature and high-humidity conditions in particular. From this point of view, the lower limit of the concentration of palladium in the wire is determined as the range that improves the ball bonding reliability.

When the sulfur group element having a predetermined concentration is contained in a palladium coating material when forming the palladium layer of the palladium-coated copper bonding wire, in particular, the palladium-concentrated region on the surface of the free air ball is formed extremely stably. Further, it is considered that the presence of a predetermined amount of the sulfur group element allows the palladium-concentrated region to be stably maintained on the surface of the free air ball until the bonding to the aluminum electrode, to make it easy to form the palladium-concentrated bonding region in the embodiment. Therefore, according to the wire bonding structure using the palladium-coated copper bonding wire containing the sulfur group element as described above for the wire portion, it is possible to significantly improve the bonding reliability under the high-temperature and high-humidity conditions.

On the other hand, as described above, even the configuration with the surface of the free air ball made rich in palladium often failed to improve the bonding reliability when aiming for use under severe conditions. The reason for this is thought that an object to be subjected to the second bonding of the wire bonding has a gold plating, silver plating, or the like on its surface in many cases, and the gold or silver derived from this plating adheres to a tail portion of the wire (an end portion of the wire that has been torn off) when the wire is cut after the second bonding of the wire bonding, causing a shrinkage cavity.

The "shrinkage cavity" is a wrinkle-like groove observed in the surface of the solidified free air ball. When there is a shrinkage cavity in the surface of the solidified free air ball, a void is made in a portion, of the bonding surface of the ball bonding of the electrode on the semiconductor chip, corresponding to the above-described groove. Therefore, it is thought that depending on the size of the void, a bonding strength of the bonding surface is weakened with time starting from this void or corrosion is likely to occur, thereby reducing the bonding reliability.

Here, as a result of the earnest examination, the inventors found out that some of the above-described shrinkage cavities are problematic and large, and the others are unproblematic and small. That is, when the surface of the solidified free air ball has a shrinkage cavity having a predetermined size or more, the void at the interface between the electrode and the ball bonding portion tends to be large, causing a significant decrease in the bonding reliability. In contrast to this, when the shrinkage cavity is smaller than the above-described size, the effect on the bonding reliability will not be a problem because the void is small. As the size of the shrinkage cavity that does not cause such a problem, the maximum length of the shrinkage cavity only needs to be two-thirds or less of the diameter of a wire in an SEM observation photograph of the shrinkage cavity. For example, when the diameter of the wire is 18 μm, the shrinkage cavity having a maximum length of greater than 12 μm can be sufficiently identified as a problematic large shrinkage cavity. It is presumed that the shrinkage cavities smaller than this size have little effect on the bonding reliability.

Then, they found out that the reason why the problematic large shrinkage cavity is formed relies on the concentration of palladium of the palladium-concentrated region (actually a mixed region of palladium and copper) covering the surface of the free air ball. That is, in the case where the concentration of palladium of the palladium-concentrated region on the surface of the free air ball exceeds a certain concentration, when the palladium-concentrated region solidifies, the inside of the ball is still soft, and thus, due to factors such as the difference in composition between the gold adhering portion near the surface of the free air ball and the region without gold adhesion, the difference in solidification speed widens and the gold adhering portion becomes a final solidification portion. Then, it was presumed that when the molten ball becomes solid, the gold adhering portion, where shrinkage is concentrated, shrinks to the inside of the ball, and a problematic large shrinkage cavity is formed. This is applied also to the case where silver adheres to the tail portion.

Conversely, when the concentration of palladium of the palladium-concentrated region is sufficiently low, the time difference in solidification of copper between the palladium-concentrated region and the inside of the ball is thought to be small. As a result, even if gold adheres to the ball, it does not shrink to the inside of the ball, thus not causing a problematic large shrinkage cavity. From such a point of view, the upper limit of the concentration of palladium of the surface of the free air ball is determined. When the ball is bonded onto the aluminum-containing electrode with a large shrinkage cavity being formed in the free air ball, a void is made at the interface between the electrode and the ball bonding portion. As a result, the bonding strength of the ball bonding interface is weakened and corrosion is likely to occur, which are problematic.

The sulfur group element in the palladium-coated copper bonding wire contributes to the formation of a palladium-distributed region near the surface of the free air ball described above. The sulfur group element is highly reactive with copper, and thus, it is thought that it is concentrated in a region where copper and palladium are in contact, mainly in the early stage when the metal of the wire melts. Reaction products of the sulfur group element and copper concentrated in this region where copper and palladium are in contact are thought to shield palladium from dissolution into the molten copper. From such a viewpoint, the amount of the sulfur group element is determined.

In order to obtain the above-described effect, 50.0% or more of the sulfur group element contained in the entire palladium-coated copper bonding wire is preferably contained between the surface of the palladium-coated copper bonding wire and a place with 50.0 atom % of palladium relative to the total of palladium and copper. This is thought to facilitate the formation of the palladium-distributed region near the surface of the free air ball, and it is possible to further improve the bonding reliability of the ball bonding.

Next, there is explained a manufacturing method of the palladium-coated copper bonding wire in this embodiment. The palladium-coated copper bonding wire in this embodiment is obtained by coating the surface of a copper wire rod, which contains, as its main component, copper to be a core material, with palladium, performing wire drawing, and performing a heat treatment as necessary. Gold coating may be performed after the palladium coating, or wire drawing and a heat treatment may be performed in stages after palladium or gold coating is performed.

When copper is used as the core material, copper of a predetermined purity is melted, and when a copper alloy is used, copper of a predetermined purity is melted together with additive elements, to thereby obtain a material of a copper core material or a material of a copper alloy core material. A heating furnace such as an arc heating furnace, a high-frequency heating furnace, a resistance heating furnace, or a continuous casting furnace is used for melting. For purpose of preventing mixture of oxygen and hydrogen from the atmosphere, the atmosphere during copper melting in the heating furnace is preferably maintained to a vacuum or an inert gas atmosphere such as argon or nitrogen. The molten material of the core material is cast and solidified to a predetermined wire diameter from the heating furnace, or the molten material of the core material is cast into a mold to make an ingot, and the ingot is repeatedly rolled and then is drawn to a predetermined wire diameter, and a copper wire rod is obtained.

Examples of the method of coating the surface of the copper wire rod with palladium or gold include a plating method (wet method) and a vapor deposition method (dry method). The plating method may be either an electrolytic plating method or an electroless plating method. Electrolytic plating, such as strike plating or flash plating, is preferable because a plating speed is fast and the adhesion of the palladium layer to the core material is good when the electrolytic plating is used for palladium plating. As a method of containing the sulfur group element in the palladium layer by the plating method, there is a method of using a plating solution containing a plating additive containing sulfur, selenium, or tellurium for a palladium plating solution and adjusting the type and amount of the plating additive in the above-described electrolytic plating. This also makes it possible to adjust the concentration of the sulfur group element in the wire.

As the vapor deposition method, physical adsorption such as a sputtering method, an ion plating method, or vacuum vapor deposition, and chemical adsorption such as plasma CVD can be used. According to these methods, it is not necessary to clean the palladium coating or the gold coating after formation, and there is no concern about surface contamination or the like during cleaning. As a method of containing the sulfur group element in the palladium layer by the vapor deposition method, there is a method of forming a palladium layer by magnetron sputtering or the like while using a palladium target containing the sulfur group element.

In this manner, the palladium-coated and gold-coated copper wire rod is drawn to a final wire diameter and heat treated. The wire drawing and the heat treatment may be performed in stages. In the above, the method of drawing the palladium-coated and gold-coated copper wire rod to a final wire diameter has been described, but the palladium-coated copper wire rod may be drawn to a predetermined wire diameter, and then coated with gold, and thereafter drawn to a final wire diameter.

A working ratio of the wire drawing can be determined according to the mechanical properties such as a breaking force and an elongation percentage required for the palladium-coated copper bonding wire to be manufactured. In general, the working ratio is preferably 90.0% or more as a working ratio in working the copper wire rod with palladium coating and, if necessary, gold coating to a final wire diameter (a working ratio in reducing the wire diameter from the wire diameter after final plating to the final wire diameter). This working ratio can be calculated as a reduction ratio of a wire cross-sectional area. The wire drawing is preferably performed in stages by using a plurality of diamond dies. In this case, a reduction of area (working ratio) per one diamond die is preferably 5.0% to 15.0%.

In the final heat treatment, there is performed a strain relief heat treatment to relieve strain of a metal structure remaining inside the wire at the final wire diameter. Regarding the conditions of the strain relief heat treatment, the temperature and the time are determined in consideration of the required wire properties.

Besides, a heat treatment according to purpose may be performed in any stage of the wire manufacture. Examples of such a heat treatment include a diffusion heat treatment in which adjacent metals are diffused to increase the bonding strength after the palladium coating or the gold coating. Performing the diffusion heat treatment makes it possible to improve the bonding strength between dissimilar metals. Regarding the conditions of the diffusion heat treatment, the temperature and the time are determined in consideration of the required wire properties.

As a method of the heat treatment, a running heat treatment, in which a wire is passed through an atmosphere of a heating vessel heated to a predetermined temperature to be heat treated, is preferred because the heat treatment conditions can be adjusted easily. In the case of the running heat treatment, the heat treatment time can be calculated by the speed at which the wire passes and the distance of the wire passing in the heating vessel. A tubular electric furnace or the like is used as the heating vessel.

According to the palladium-coated copper bonding wire in this embodiment explained above, the shrinkage cavity during ball formation is suppressed, and the ball bonding reliability is excellent even under the high-temperature and high-humidity. Therefore, since the wire bonding structure with high long-term reliability can be formed, the palladium-coated copper bonding wire is suitable for QFP (Quad Flat packaging), BGA (Ball Grid Array), and QFN (Quad For Non-Lead Packaging). Further, since the highly reliable wire bonding structure can be formed, the palladium-coated copper bonding wire in this embodiment is suitable for use in high-temperature and high-humidity environments, such as in devices for automobile use.

(Semiconductor Device and Manufacturing Method Thereof)

Figure 7:
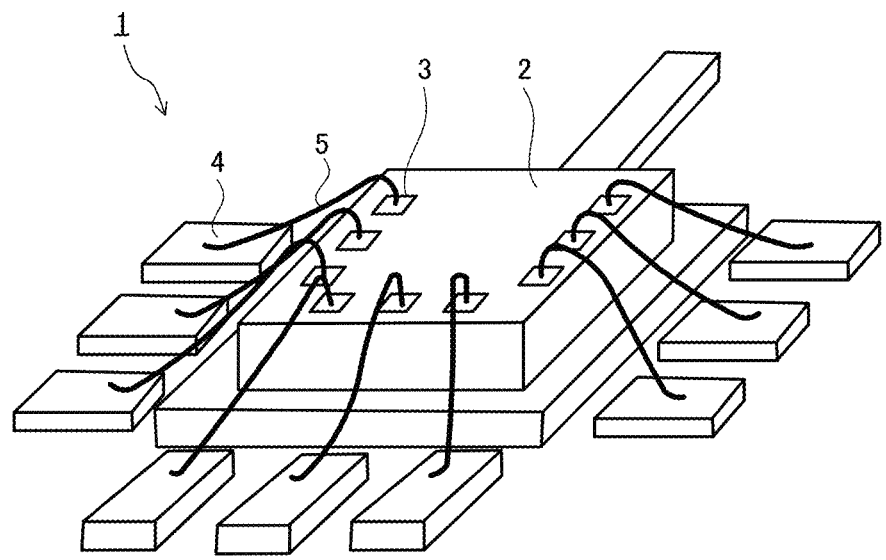
FIG. 7 is a schematic view illustrating a semiconductor device in an embodiment.

Next, there is explained a semiconductor device using the palladium-coated copper bonding wires in the above-described embodiment. As illustrated in FIG. 7, a semiconductor device 1 in this embodiment includes a semiconductor chip 2, aluminum-containing aluminum electrodes 3 provided on the semiconductor chip 2, gold-coated external electrodes 4 provided outside the semiconductor chip 2, and bonding wires 5 connecting the aluminum electrodes 3 and surfaces of the external electrodes 4. Incidentally, in FIG. 7, the case of having a gold coating on the external electrode is explained as an example, but the same is applied even if a silver coating is provided in place of the gold coating or a silver coating is provided together with the gold coating.

In the semiconductor device 1, the bonding wire 5 is made of the palladium-coated copper bonding wire in the above-described embodiment. Further, it includes a palladium-concentrated bonding region with 2.0 mass % or more of the concentration of palladium relative to the total of a constituent element of the surface of the aluminum electrode 3, copper, and palladium in a bonding surface of the aluminum electrode 3 and the bonding wire 5.

The semiconductor chip 2 is made by including an integrated circuit (IC) made of a silicon (Si) semiconductor, a compound semiconductor, or the like. The aluminum electrode is formed, for example, by coating a surface of a silicon base material with an electrode material such as Al, AlSiCu, or AlCu. The external electrode 4 is an electrode for supplying power to the semiconductor chip 2 from the outside. The power from the external electrode 4 is supplied to the semiconductor chip 2 via the bonding wire 5.

In the manufacture of the semiconductor device 1 in this embodiment, the connection of the aluminum electrode 3 and the external electrode 4 by the bonding wire 5 is made as follows, for example. Using a bonding device, a capillary jig used for the connection by passing a bonding wire through its inside, and so on, for example, heat is input to the tip of the wire gripped by the capillary by arc discharge, to heat and melt the tip of the wire. Thereby, a free air ball is formed at the tip of the wire. Then, for example, with the semiconductor chip 2 heated within a range of 140~200° C., this free air ball is crimped and bonded onto the aluminum electrode 3 to form ball bonding (first bonding). After that, the opposite end of the bonding wire 5 apart from the first bonding by a predetermined distance is directly wedge bonded to the external electrode 4 by ultrasonic crimping (second bonding).

In the manufacturing method of the semiconductor device in this embodiment, the free air ball forming conditions are the same as those described above. Specifically, for example, when the diameter of the bonding wire 5 is 10 to 30 μm, preferably 15 to 25 μm, and more preferably 18 to 20 μm, a bonder apparatus is used and arc discharge conditions are set so that a discharge current value becomes 30 to 90 mA and the diameter of the free air ball becomes 1.5 to 2.3 times the diameter of the wire. For the bonder apparatus, a commercially available product such as a bonder apparatus (fully automatic Cu wire bonder; IConn ProCu PLUS) manufactured by KANDS Co., Ltd., for example, can be used. When using such a bonder apparatus, the apparatus is preferably set that a discharge time is 50 to 1000 μs, an EFO-Gap is 25 to 45 mil (about 635 to 1143 μm), and a tail length is 6 to 12 mil (about 152 to 305 μm). When another bonder apparatus other than this bonder apparatus is used, the conditions only need to be the same as above, which are, for example, the condition under which the diameter of the free air ball becomes the same size as above. Further, in order to make a mixed gas atmosphere of nitrogen and hydrogen or a nitrogen gas atmosphere for the tip portion of the wire, the above-described gas is sprayed at a gas flow rate of 0.2 to 0.8 L/min and preferably 0.3 to 0.6 L/min. The gas when forming the free air ball is preferred to be a mixed gas of 95.0 vol % of nitrogen and 5.0 vol % of hydrogen, and the diameter of the free air ball may be within the above-described range as the target value.

Further, the conditions of the ball bonding and the wedge bonding can be adjusted appropriately according to the structure and application of the semiconductor device, and in the case of a wire having a diameter φ of 18 μm and having had a free air ball with a diameter of 33 μm formed thereon, for example, the bonder apparatus is set as follows: a ball crimping force of 7.5 gf, an ultrasonic application output of 70 mA, a ball crimping time of 15 ms, and a crimping temperature of 150° C., and thereby, the ball bonding can be formed with the height Y of the second ball compressed portion 20b of about 10 μm and the maximum width $X_0$ of the second ball compressed portion 20b in the direction substantially parallel to the bonding surface 21 of about 40 μm. The wedge bonding can be performed with a loop length of 2 mm under the conditions of a crimping force of 70 gf, a crimping time of 20 ms, a crimping temperature of 150° C., a frequency of 200 kHz, an amplitude of 3.0 μm, and 2 cycles in the scrubbing mode.

The manufacturing method of the semiconductor device in the embodiment is a manufacturing method of a semiconductor device including: a semiconductor chip; an aluminum-containing aluminum electrode provided on the semiconductor chip; a gold-coated or silver-coated external electrode provided outside the semiconductor chip; and a bonding wire connecting the aluminum electrode and a surface of the external electrode, in which the bonding wire is a palladium-coated copper bonding wire including: a core material containing copper as a main component; and a palladium layer on the core material, and containing a sulfur group element, the palladium-coated copper bonding wire in which a concentration of palladium is 1.0 mass % or more and 4.0 mass % or less and the total concentration of the sulfur group element is 5.0 mass ppm or more and 50 mass ppm or less, relative to the total of copper, palladium, and the sulfur group element of the palladium-coated copper bonding wire. Then, on the tip of the palladium-coated copper bonding wire, a free air ball including a palladium-concentrated region with the average concentration of palladium of 6.5 atom % or more and 30.0 atom % or less relative to the total of copper and palladium within a range from a surface of a tip portion of the ball to 5.0 nm or more and 100.0 nm or less is formed, the palladium-coated copper bonding wire is bonded to the aluminum electrode via the free air ball, and a portion of the palladium-coated copper bonding wire apart from the free air ball by substantially the length of the bonding wire is second bonded to the surface of the external electrode.

The semiconductor device in the embodiment is suitable for QFP (Quad Flat packaging), BGA (Ball Grid Array), and QFN (Quad For Non-Lead Packaging) used in printed wiring boards, and the like, for example.

According to the semiconductor device in this embodiment explained above, in the wire bonding, a shrinkage cavity in the ball during ball bonding is suppressed, and the ball bonding reliability is excellent even under high-temperature and high-humidity. Therefore, since a bonding structure with long-term high reliability can be formed, the semiconductor device in this embodiment is suitable for use in high-temperature and high-humidity environments, such as in devices for automobile use. Further, according to the manufacturing method of the semiconductor device in this embodiment, a bonding structure with long-term high reliability is formed, and thus, it is possible to obtain a semiconductor device suitable for use in high-temperature and high-humidity environments, such as in devices for automobile use.

EXAMPLES

Next, there are explained examples. The present invention is not limited to the following examples. Examples 1 to 19 and Examples 33 to 35 are examples, and Examples 20 to 32 are comparative examples.

Examples 1 to 19

Copper (Cu) with a purity of 99.99 mass % or more was used as the core material, this was continuously cast and rolled while a preheat treatment being performed thereon, and then primarily drawn, and thereby a copper wire rod (0.5 mm in diameter) was obtained.

The palladium coating layer was formed as follows. Plating baths were prepared by adding additives containing sulfur, selenium, and tellurium to commercially available palladium electroplating baths, and controlling the concentrations of sulfur, selenium, and tellurium in the plating baths so that the concentrations relative to the entire wire (the total of copper, palladium, and sulfur group elements) would be the concentrations described in the table below, respectively. With the copper wire rod immersed in the plating bath, a current was applied to the copper wire rod at a current density of 0.75 $A/dm^2$ to form a palladium coating containing sulfur, selenium, or tellurium. In the case of forming a palladium coating containing two or more of sulfur, selenium, and tellurium, a plating bath containing two or more of the above-described additives was used.

Thereafter, a palladium-coated copper bonding wire with a final diameter of 18 µm or 25 µm was obtained by performing continuous secondary wire drawing with diamond dies in a wet process without performing a baking treatment, followed by performing a refining heat treatment at 480° C.× for 1 second.

Incidentally, the average working ratio of each example, calculated by wire cross-sectional areas before and after wire drawing from the wire after coating to the final wire diameter, is 99.0% or more in the case of the final wire diameter being 18 µm and 25 µm, and the wire speed in the wire drawing is 100~1000 m/min.

The concentration of palladium in the palladium-coated copper bonding wire was measured as follows. The manufactured wire of about 1000 m was dissolved in aqua regia, and the concentration of palladium (Pd) in the solution was found by high-frequency inductively coupled plasma emission spectroscopy (ICPS-8100 by Shimadzu Corporation).

The concentration of the sulfur group elements in the palladium-coated copper bonding wire was measured as follows. The manufactured wire of about 100 m was dissolved in aqua regia, and the concentration of sulfur (S), selenium (Se), or tellurium (Te) in the solution was found by an inductively coupled plasma mass spectrometer (Agilent 8800 manufactured by Agilent Technologies Japan, Ltd.). The compositions of the obtained palladium-coated copper bonding wires are illustrated in Tables 1, 2.

(Observation of a Crack in a Wire Surface)

The copper wire rod after palladium plating was subjected to a torsion test, and the appearance of the surface of the wire rod that had undergone the torsion test was observed with an optical stereomicroscope (product name: SZX16 manufactured by Olympus Corporation) to evaluate whether a crack of palladium had reached copper of the core material. Those with a crack not reaching copper were evaluated as having no crack in a wire surface (o), and those with a crack reaching copper were evaluated as having a crack in a wire surface (x). In the torsion test, a device (device name: TO-202) manufactured by MAEKAWA TESTING MACHINE MFG. Co., Ltd. was used, both ends of an about 20-cm sampled wire were fixed and rotated 180 degrees clockwise and 180 degrees counterclockwise, the rotations were performed for 7 sets, and then the appearance was observed. Results are illustrated in Tables 1, 2. Incidentally, the wires with a crack reaching copper are illustrated as not performed (-) in the table because subsequent evaluations of a shrinkage cavity and a HAST, and so on were not performed thereon.

(Analysis of a Free Air Ball)

With the palladium-coated copper bonding wire with a diameter of 18 µm obtained in Example 1, a free air ball with a diameter of about 33 µm (about 1.8 times the diameter of the wire) was formed in a (fully automatic Cu wire bonder; IConn ProCu PLUS) type ultrasonic device manufactured by KANDS Co., Ltd. by setting an arc discharge current value (Electronic Flame-Off (EFO) current value) to 65 mA and adjusting a discharge time in a range of 50~1000 µs. A free air ball forming atmosphere was a mixed gas of 95.0 vol % of nitrogen gas and 5.0 vol % of hydrogen gas, and the gas was sprayed onto the tip of the wire at a gas flow rate of 5.0 L/min. Substantially the center of the formed free air ball on the tip side (the side opposite to a wire neck portion) was analyzed in the depth direction by a scanning Auger electron spectroscopy analyzer (JAMP-9500F (device name) manufactured by JEOL Ltd.). The setting conditions of the Auger electron spectroscopy analyzer are as follows: an acceleration voltage of a primary electron beam of 10 kV, a current of 50 nA, a beam diameter of 5 µm, an acceleration voltage of argon ion sputtering of 1 kV, and a sputtering rate of 2.5 nm/min (in terms of $SiO_2$). The average concentration of palladium relative to the total of copper and palladium was found by analyzing nine or more points at equal intervals from the surface of the tip portion of the free air ball to 5.0~100.0 nm in the depth direction. Specific analysis points are 31 points every 1.0 nm from the surface to about 30.0 nm, 5 points every 6 nm from 31.0~60.0 nm, and 35 points every 12.0 nm from 61.0~480.0 nm.

Figure 4:
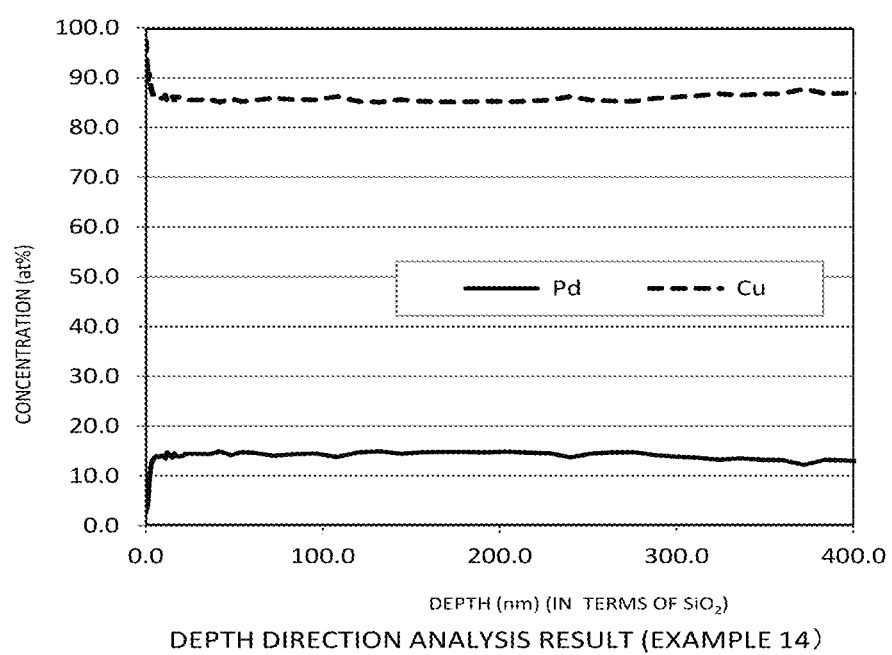
FIG. 4 is an Auger (FE-AES) analysis profile of a surface of a tip portion of the free air ball in the example.

In Examples 2 to 32, with the palladium-coated copper bonding wire obtained above, a free air ball was formed by using the same fully automatic Cu wire bonder as above so as to obtain a predetermined diameter of the ball in a range of 1.5~2.3 times the diameter of the wire under the same conditions as in Example 1 except that the Electronic Flame-Off (EFO) current was adjusted to a predetermined value in a range of 30~90 mA and the discharge time was adjusted to a predetermined value in a range of 50~1000 µs. In Example 10 and Example 31, a copper core material containing 1.3 mass ppm of palladium relative to the entire core material was used. In each of the obtained free air balls in the examples, the average concentration of palladium from the surface of the tip portion of the ball to 5.0 to 100.0 nm in the depth direction was found as in Example 1. Results are illustrated in Tables 1, 2 along with the composition of the wire and the free air ball forming conditions. Further, an Auger analysis profile of the free air ball in Example 14 from the tip portion in the depth direction is illustrated in FIG. 4. Incidentally, in Examples 2 to 31, the average concentration of palladium from the surface of the tip portion of the ball to 5.0 to 100.0 nm in the depth direction was found, but the average concentration of palladium is about the same as the values in the table below even in the range of 5.0~400.0 nm. Examples 20 to 23 were not evaluated further because a crack in a wire surface occurred in a process of a core wire.

(Shrinkage Cavity Evaluation)

Figure 2:
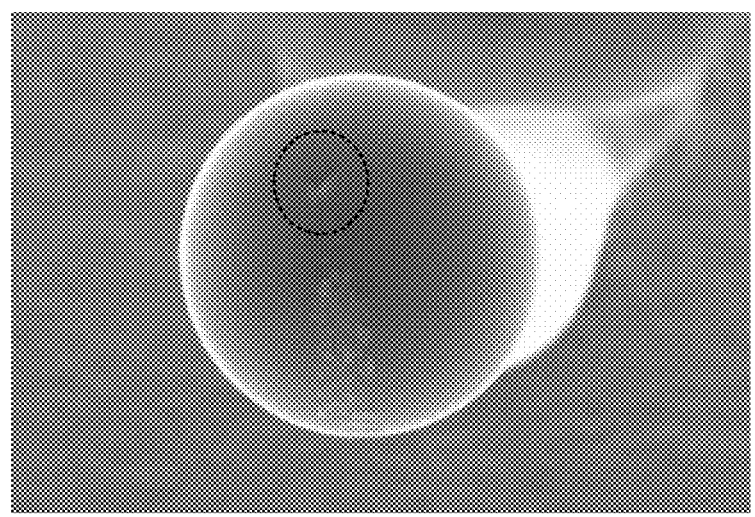
FIG. 2 is a photograph of a free air ball having an unproblematic small shrinkage cavity observed in an example.
Figure 3:
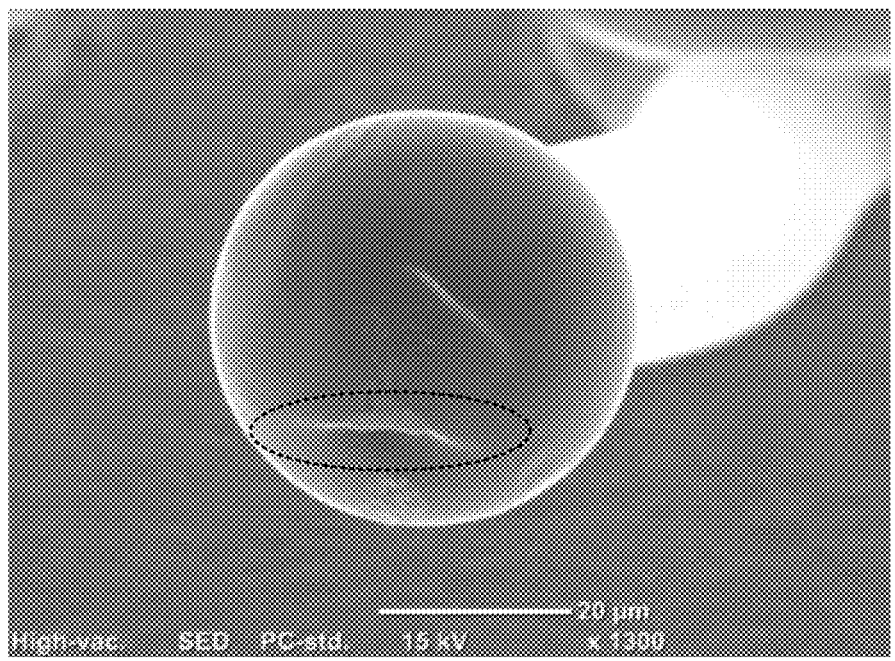
FIG. 3 is a photograph of a free air ball having a large shrinkage cavity observed in a comparative example.

Further, 30 free air balls formed under the same conditions as above were observed with an SEM for the presence or absence of a large shrinkage cavity in the surface of the ball. In SEM observation photographs, a shrinkage cavity with a maximum length of greater than 12 µm was evaluated as a problematic shrinkage cavity, and a shrinkage cavity with a maximum length of 12 µm or less was evaluated as an unproblematic shrinkage cavity. Incidentally, FIG. 2 illustrates a free air ball with an unproblematic small shrinkage cavity, FIG. 3 illustrates a free air ball with a problematic large shrinkage cavity, and the shrinkage cavities are each circled and indicated by a broken line in a photograph. The problematic large shrinkage cavity is a large wrinkle-like groove formed in the surface of the free air ball, as illustrated in FIG. 3. Those with no shrinkage cavity and those with an unproblematic small shrinkage cavity were evaluated as having no shrinkage cavity (o), and those with at least one problematic shrinkage cavity were evaluated as having a shrinkage cavity (x).

(Fabrication of Test Pieces for HAST and HTS)

With the palladium-coated copper bonding wire obtained in each of the examples, wire bonding was performed on Al-1.0 mass % Si-0.5 mass % Cu alloy electrodes having a thickness of 2 μm on a 400 μm thick Si chip on a BGA (ball grid array) substrate by the same fully automatic Cu wire bonder as above under the same conditions as those for the above-described free air ball, ball bonding, and second bonding. That is, the free air ball was formed by using the same fully automatic Cu wire bonder as above so as to obtain a predetermined diameter of the ball in a range of 1.5 to 2.3 times the diameter of the wire with the Electronic Flame-Off (EFO) current adjusted to a predetermined value in a range of 30 to 90 mA, the discharge time adjusted to a predetermined value in a range of 50 to 1000 μs, the EFO-Gap of 25 to 45 mil (about 635 to 1143 μm), and the tail length of 6 to 12 mil (about 152 to 305 μm). Further, a mixed gas of 95.0 vol % of nitrogen and 5.0 vol % of hydrogen was sprayed onto the tip portion of the wire at a gas flow rate of 0.3 to 0.6 L/min. For example, in the case of Example 1 in which the diameter of the wire φ was 18 μm, a free air ball with a ball diameter of 33 μm was formed, and the first bonding conditions were adjusted to a ball crimping force of 7.5 gf, an ultrasonic application output of 70 mA, a ball crimping time of 15 ms, and a crimping temperature of 150° C. in the above-described fully automatic Cu wire bonder so that the height Y of the second ball compressed portion 20b became 10 μm and the maximum width $X_0$ of the second ball compressed portion 20b in the direction parallel to the bonding surface 21 became 40 μm, and the ball was bonded to the electrode. Further, regarding the second bonding, the wedge bonding was performed under the conditions of a crimping force of 70 gf, a crimping time of 20 ms, a crimping temperature of 150° C., a frequency of 200 kHz, an amplitude of 3.0 μm, and 2 cycles in the scrubbing mode, and 1,000 wires were bonded with a loop length of 2 mm. On this occasion, only bonding portions adjacent to each other of the Al-1.0 mass % Si-0.5 mass % Cu alloy electrodes on the chip were electrically connected, the two wires adjacent to each other electrically form one circuit, and 500 circuits in total were formed. Thereafter, the Si chip on the BGA substrate was encapsulated in resin by using a commercially available transfer molding machine (GPGP-PRO-LAB80 manufactured by Dai-ichi Seiko Co., Ltd.) to fabricate a test piece. Incidentally, as the resin used for the encapsulation, a commercially available non-halogen-free resin was used. Regarding the test pieces other than Example 1, the ball bonding was performed so that the height Y of the second ball compressed portion 20b became 7 to 13 μm and the maximum width $X_0$ of the second ball compressed portion 20b in the direction parallel to the bonding surface 21 became 1.2 times the formed free air ball.

<HAST (Highly Accelerated Temperature and Humidity Stress Test)>

This test piece was held by using a HAST device (PCR8D manufactured by HIRAYAMA Manufacturing Corporation) at 130° C.×85.0% RH (relative humidity) for 400 hours and 600 hours. Before and after the holding, electrical resistance values of the 500 circuits described above were measured for each time period, and the case with at least one circuit in which the electrical resistance value after the holding exceeded 1.1 times the electrical resistance value before the holding was evaluated as defective (x) and the case where in all the 500 circuits, the resistance values were less than 1.1 times the resistance value was evaluated as excellent (⊚). After the 400-hour holding, the electrical resistance values were less than 1.1 times the resistance value in all the samples.

<HTS (High Temperature Storage Test)>

Further, the test piece was held by using a HTS device (DRS420DA manufactured by ADVANTEC CO., LTD.) at 220° C. for 2000 hours. Before and after the holding, electrical resistance values of the 500 circuits were measured similarly to the above, and the case with at least one circuit in which the electrical resistance value after the holding exceeded 1.1 times the electrical resistance value before the holding was evaluated as defective (x) and the case where in all the 500 circuits, the resistance values were less than 1.1 times the resistance value was evaluated as excellent (⊚). Evaluation results of the HAST test and the HTS test are illustrated in Tables 1, 2. The "number of defects" in Table 2 is the number of circuits with the electrical resistance value after the holding exceeding 1.1 times the electrical resistance value before the holding.

TABLE 1

| | | Pd-coated Cu bonding wire | | | | | | | | | | |
|---|---|---|---|---|---|---|---|---|---|---|---|---|
| | | Concentration of Pd (derived from Pd layer) in entire wire | Concentration of sulfur group element in entire wire (mass ppm) | | | Free air ball | | | | Evaluation | | |
| | Diameter of wire | | | | | Arc discharge current | Diameter of ball | Concentration of Pd of surface | Crack in wire | Shrinkage of cavity | HAST | |
| Example | (μm) | (mass %) | S | Se | Te | (mA) | (μm) | (atom %) | surface | evaluation | 400 hrs | 600 hrs | HTS |
| Example 1 | 18 | 1.2 | 7 | — | — | 65 | 33 | 6.7 | ○ | ○ | ⊚ | ⊚ | ⊚ |
| 2 | 18 | 1.2 | 7 | — | — | 30 | 30 | 6.8 | ○ | ○ | ⊚ | ⊚ | ⊚ |
| 3 | 18 | 1.2 | 7 | — | — | 90 | 36 | 6.6 | ○ | ○ | ⊚ | ⊚ | ⊚ |
| 4 | 18 | 1.5 | — | 8 | — | 65 | 27 | 7.2 | ○ | ○ | ⊚ | ⊚ | ⊚ |
| 5 | 25 | 1.5 | — | 8 | — | 90 | 40 | 6.8 | ○ | ○ | ⊚ | ⊚ | ⊚ |
| 6 | 25 | 1.5 | — | 8 | — | 65 | 45 | 7.0 | ○ | ○ | ⊚ | ⊚ | ⊚ |
| 7 | 18 | 2.0 | — | — | 18 | 65 | 38 | 12.0 | ○ | ○ | ⊚ | ⊚ | ⊚ |
| 8 | 25 | 2.0 | — | — | 19 | 30 | 50 | 9.7 | ○ | ○ | ⊚ | ⊚ | ⊚ |
| 9 | 18 | 2.3 | 11 | — | — | 65 | 34 | 20.0 | ○ | ○ | ⊚ | ⊚ | ⊚ |

TABLE 1-continued

Pd-coated Cu bonding wire

| | | | | | Free air ball | | | Evaluation | | | |
| | | Concentration of Pd (derived from Pd layer) in entire wire | Concentration of sulfur group element in entire wire (mass ppm) | | | Arc discharge | Diameter of ball | Concentration of Pd of surface | Crack in wire | Shrinkage of cavity | HAST | |
| Example | Diameter of wire (µm) | (mass %) | S | Se | Te | current (mA) | (µm) | (atom %) | surface | evaluation | 400 hrs | 600 hrs | HTS |
|---|---|---|---|---|---|---|---|---|---|---|---|---|---|
| 10 | 25 | (※) 3.6 (2.3) | 11 | — | — | 30 | 45 | 15.3 | ○ | ○ | ◎ | ◎ | ◎ |
| 11 | 18 | 1.3 | — | 18 | — | 65 | 37 | 11.0 | ○ | ○ | ◎ | ◎ | ◎ |
| 12 | 18 | 1.3 | — | 18 | — | 30 | 30 | 13.4 | ○ | ○ | ◎ | ◎ | ◎ |
| 13 | 18 | 1.6 | — | — | 48 | 65 | 28 | 13.0 | ○ | ○ | ◎ | ◎ | ◎ |
| 14 | 18 | 1.6 | — | — | 48 | 90 | 35 | 14.0 | ○ | ○ | ◎ | ◎ | ◎ |
| 15 | 18 | 2.1 | 7 | 6 | — | 65 | 32 | 16.0 | ○ | ○ | ◎ | ◎ | ◎ |
| 16 | 18 | 2.1 | 7 | 6 | — | 90 | 34 | 16.5 | ○ | ○ | ◎ | ◎ | ◎ |
| 17 | 18 | 2.2 | — | 13 | 24 | 65 | 36 | 23.0 | ○ | ○ | ◎ | ◎ | ◎ |
| 18 | 25 | 2.2 | — | 13 | 24 | 30 | 42 | 26.5 | ○ | ○ | ◎ | ◎ | ◎ |
| 19 | 18 | 2.4 | 6 | 7 | 15 | 65 | 29 | 28.0 | ○ | ○ | ◎ | ◎ | ◎ |

※ A copper wire rod containing 1.3 mass % of Pd was used for a copper core material.

TABLE 2

Pd-coated Cu bonding wire

| | | | | | | Free air ball | | | Evaluation | | | | | |
| | | Concentration of Pd (derived from Pd layer) in entire wire | Concentration of sulfur group element in entire wire (mass ppm) | | | Arc discharge current | Diameter of ball | Concentration of Pd of surface | Crack in wire | Shrinkage of cavity | HAST (number of defects) | | HTS (number of defects) | Overall evaluation |
| Example | Diameter of wire (µm) | (nass %) | S | Se | Te | (mA) | (µm) | (atom %) | surface | evaluation | 400 hrs | 600 hrs | | |
|---|---|---|---|---|---|---|---|---|---|---|---|---|---|---|
| CE 20 | — | 1.9 | — | — | 55 | — | — | — | × | — | — | — | — | × |
| 21 | — | 2.2 | — | 28 | — | — | — | — | × | — | — | — | — | × |
| 22 | — | 2.2 | — | 28 | — | — | — | — | × | — | — | — | — | × |
| 23 | — | 2.0 | 15 | — | — | — | — | — | × | — | — | — | — | × |
| 24 | 18 | 1.3 | — | — | 12 | 65 | 28 | 5.5 | ○ | ○ | ◎ | × (4) | × (6) | × |
| 25 | 18 | 1.3 | — | — | 12 | 90 | 34 | 5.3 | ○ | ○ | ◎ | × (6) | × (6) | × |
| 26 | 18 | 1.6 | — | — | 10 | 65 | 37 | 5.2 | ○ | ○ | ◎ | × (3) | × (5) | × |
| 27 | 25 | 1.6 | — | — | 10 | 65 | 47 | 5.0 | ○ | ○ | ◎ | × (5) | × (8) | × |
| 28 | 18 | 1.6 | 2 | 3 | 3 | 65 | 29 | 4.5 | ○ | ○ | ◎ | × (8) | × (10) | × |
| 29 | 18 | 0.8 | 6 | 18 | — | 65 | 35 | 3.0 | ○ | ○ | ◎ | × (7) | × (12) | × |
| 30 | 18 | 2.8 | — | 10 | 26 | 65 | 30 | 32.0 | ○ | × | ◎ | × (18) | × (22) | × |
| 31 | 18 | (※) 4.1 (2.8) | — | 10 | 26 | 65 | 32 | 38.6 | ○ | × | ◎ | × (16) | × (21) | × |
| 32 | 18 | 3.5 | 10 | — | — | 65 | 33 | 36.0 | ○ | × | ◎ | × (24) | × (30) | × |

※ A copper wire rod containing 1.3 mass % of Pd was used for a copper core material.
CE: Comparative Tables 1, 2 reveal that according to the palladium-coated copper bonding wires having 1.0 to 4.0 mass % of the concentration of palladium in the entire wire, containing sulfur, selenium, and tellurium with concentrations in predetermined ranges, and including the palladium-concentrated region containing 6.5 to 30.0 atom % of palladium on average on the surface of the solidified free air ball, the reliability in the HAST and the HTS was improved while suppressing the occurrence of a shrinkage cavity as compared to the palladium-coated copper bonding wire in the comparative example having no palladium-concentrated region.

For example, in the above-described device for automobile use, the biggest problem is the bonding life of the ball bonding portion (first bonding) where the free air ball and the electrode are bonded in particular. The device for automobile use is required to meet the condition that the resistance value of the semiconductor device, where the aluminum electrode and the ball are bonded to be resin-encapsulated, after the exposure for a long period of time in the HAST needs to be suppressed to an increase of 1.1 times or less the resistance value before the exposure. It is the halogen elements such as chlorine and the moisture, which are contained in the resin used for the encapsulation to be performed after ball bonding, that adversely affect the bonding life, namely, the increase in resistance value. These chlorine and moisture corrode the intermetallic compound generated in the ball bonding portion, causing the resistance value of the bonding portion to increase. The increase in resistance value causes poor current flow and interferes with the transmission of electrical signals, and in the case of automotive applications, the increase in resistance value may lead to automobile accidents, resulting in a serious problem. In the palladium-coated copper bonding wires in the above-described examples, the results of the HAST test are all good even after 600-hour exposure, thus indicating that the bonding reliability is high and such a serious problem as above is not caused even when they are used for the devices for automobile use.

It is thought that the test piece in the comparative example also had a region with a high concentration of palladium, which was lower in concentration than the example, on the surface of the free air ball and near the ball bonding surface, and therefore, it is thought that the increase in electrical resistance value was suppressed up to 400 hours in the HAST test.

Examples 33 to 35

Next, the properties of a palladium-coated copper bonding wire including a gold layer on the palladium layer were confirmed. Palladium-coated copper bonding wires each having a gold layer were fabricated in the same manner as in Examples 1, 4, and 7, except that after coating with palladium, gold plating was further applied using a commercially available gold plating bath in the manufacturing process of the palladium-coated copper bonding wires in Examples 1, 4, and 7 (Examples 33 to 35). Incidentally, the concentration of each element in Table 3 was calculated without including the concentration of gold of the gold layer in the entire wire.

of the wire bonding length from the second bonding point was evaluated by a breaking strength obtained when a tensile test was performed with a predetermined pull hook. Results are illustrated in the column of "2nd pull strength" in Table 3, and the case with a breaking strength of 4.0 gf or more was evaluated as excellent (⊚) and the case with a breaking strength of 3.5 gf or more and less than 4.0 gf was evaluated as good (o). Further, the thickness of the gold layer in Table 3 is the value found by calculating the mass of gold per unit length based on the concentration of gold and the specific gravity of gold, and assuming that the wire having a unit length has a perfectly circular cross section and gold is uniformly present on the uppermost surface of the wire having a unit length.

Further, in the respective examples, the shrinkage cavity, the HAST, and the HTS were evaluated as in Example 1. As illustrated in Table 3, the evaluations of the shrinkage cavity, the HAST, and the HTS in the palladium-coated copper bonding wire including the gold layer were as good as those of the palladium-coated copper bonding wire including no gold layer. This is thought to be because the amount of gold derived from the gold layer was very small as compared to the gold to adhere during the second bonding, and because gold covered the entire wire and did not flocculate locally, and thus no shrinkage cavity occurred.

TABLE 3

| Example | Gold Layer (thickness) | Concentration relative to total of Cu, Pd and sulfur goup element | | | | Concentration of Pd of surface of FAB (atom %) | Evaluation | | | | |
|---|---|---|---|---|---|---|---|---|---|---|---|
| | | Pd (mass %) | S (mass ppm) | Se (mass ppm) | Te (mass ppm) | | Die wear | 2nd pull strength | Shrinkage cavity | HAST | HTS |
| Example 33 | 2 nm | 1.2 | 7 | — | — | 6.7 | ⊚ | ⊚ | ○ | ⊚ | ⊚ |
| 34 | 4 nm | 1.5 | — | 8 | — | 7.2 | ⊚ | ⊚ | ○ | ⊚ | ⊚ |
| 35 | 6 nm | 2.0 | — | — | 18 | 12.0 | ⊚ | ⊚ | ○ | ⊚ | ⊚ |
| 1 | None | 1.2 | 7 | — | — | 6.7 | ○ | ○ | ○ | ⊚ | ⊚ |
| 4 | None | 1.5 | — | 8 | — | 7.2 | ○ | ○ | ○ | ⊚ | ⊚ |
| 7 | None | 2.0 | — | — | 18 | 12.0 | ○ | ○ | ○ | ⊚ | ⊚ |

The palladium-coated copper bonding wires each including the gold layer and the palladium-coated copper bonding wires in Examples 1, 4, and 7 each including no gold layer were subjected to a die wear test, and results are illustrated in the column of "Die wear" in Table 3. In the die wear test, the wire of each sample was drawn to 50,000 m with a final diameter of 18 μm from the diameter of the wire after gold plating by performing continuous wire drawing through a plurality of dies. The wear of the die before and after the wire drawing was evaluated as follows: those in which the inside diameter of the die at the final wire diameter of 18 μm was increased in size by less than 0.1 μm as compared to that before working were evaluated as very good (⊚), and those in which the inside diameter of the die was increased in size by 0.1 μm or more and less than 0.2 μm were evaluated as good (o).

Further, a pull strength was measured on the palladium-coated copper bonding wire including the gold layer and the palladium-coated copper wire including no gold layer in order to make a comparison of a bonding strength of the second bonding. In a pull strength bondability test of the second bonding, the same bonder apparatus manufactured by KANDS Co., Ltd. as above was used, wire bonding was performed with a loop length of 2 mm and a loop height of 200 μm, and the position on the first bonding side at 20.0%

(Analysis of a Wire Bonding Structure)

In Example 1, under the same conditions as those under which the above-described test pieces for HAS and HTS are fabricated, a free air ball was formed and the conditions of ball bonding (the ball crimping force of 7.5 gf, the ultrasonic application output of 70 mA, the ball crimping time of 15 ms, and the crimping temperature of 150° C.) were adjusted in the bonder apparatus so that the height Y of the second ball compressed portion 20b became 10 μm and the maximum width $X_0$ of the second ball compressed portion 20b in the direction parallel to the bonding surface 21 became 40 μm to form a ball bonding on the aluminum electrode of the chip. An obtained ball bonding portion was molded by the above-described method and was cut by using an ion milling apparatus (IM4000 manufactured by Hitachi High-Technologies Corporation) so as to make a surface parallel to the center line in the wire longitudinal direction exposed. A cut surface was line-analyzed from a predetermined place on the wire side in the direction vertical to the bonding surface by the field-emission scanning electron microscopy/energy dispersive X-ray spectrometry (FE-SEM/EDX). The analysis conditions are as follows: an acceleration voltage of 6 keV, a measurement region φ of 0.18 μm, and a measurement interval of 0.02 μm as the setting of the SEM-EDX. The line-analysis place is the same as $P_1$, $P_2$ illustrated in FIG. 1.

Figure 5:
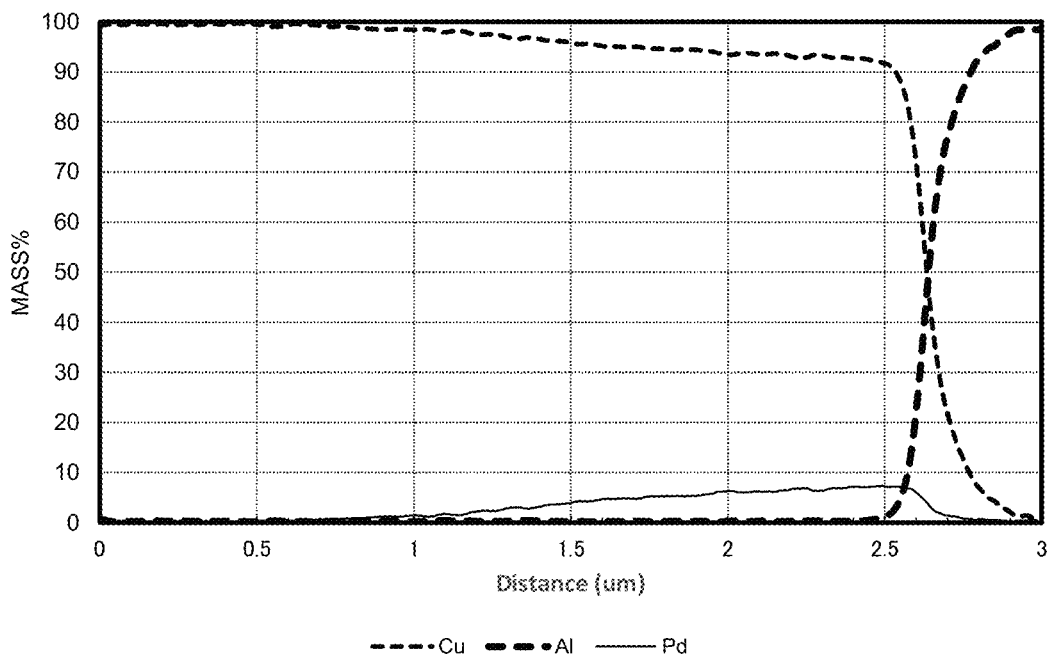
FIG. 5 is a field-emission scanning electron microscopy/energy dispersive X-ray spectrometry (FE-SEM/EDX) profile of a bonding structure in the example.
Figure 6:
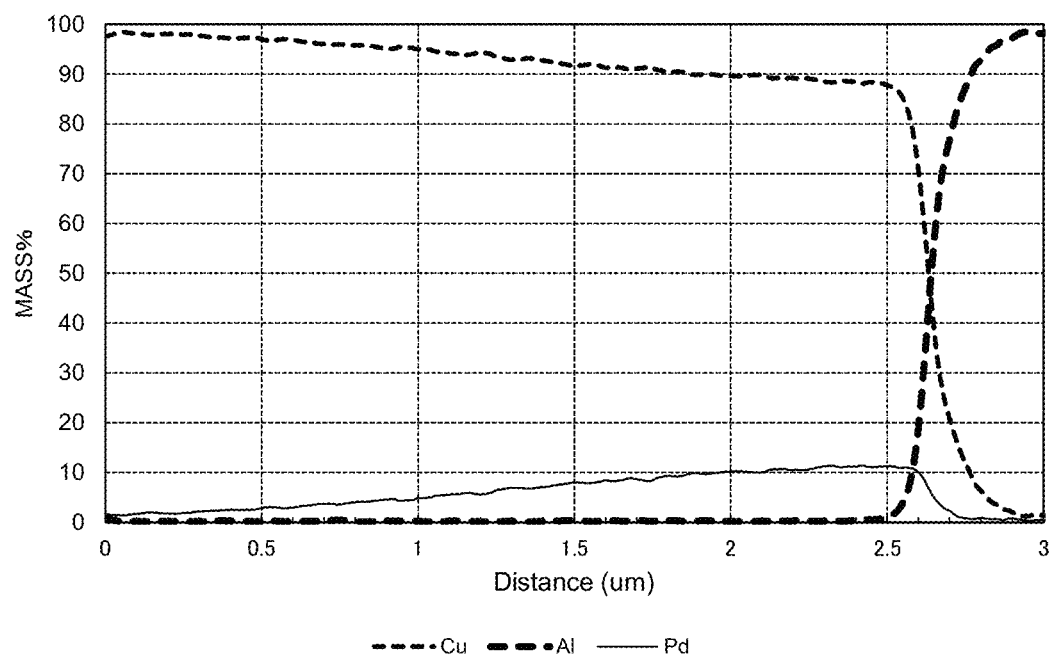
FIG. 6 is a FE-SEM/EDX profile of another portion of the bonding structure in the example.

That is, the line analysis was performed to pass through points each located at a distance of one-eighth of the maximum width of the second ball compressed portion in the direction parallel to the bonding surface from each of both ends. Obtained FE-SEM/EDX profiles are illustrated in FIG. 5 and FIG. 6. FIG. 5 and FIG. 6 reveal that the palladium-concentrated bonding region with the ratio of palladium to the total of aluminum, copper, and palladium of 2.0 mass % or more is present near the bonding surface where aluminum is greater than 0.5 mass % and 95.0 mass % or less. Further, the width (depth) of the palladium-concentrated bonding region was about 220 nm on average for the two points.

In Examples 2 to 19 and Examples 33 to 35, the line analysis portions at the above-described same two points were line-analyzed in the same manner as above. The case where the palladium-concentrated bonding region with the concentration of palladium being 2.0 mass % or more relative to the total of aluminum, copper, and palladium was observed at the both two points was set as "○" and the case where the palladium-concentrated bonding region was not observed at the both two points was set as "x." Incidentally, there was no example where the palladium-concentrated bonding region was observed at only one of the two points. These results are illustrated in Table 4. The halogen elements and the moisture from the encapsulating resin, and so one are highly likely to penetrate through small gaps or the like at the both ends near the ball bonding surface, and thus, the presence of the palladium-concentrated bonding regions with high corrosion resistance near the both ends of the analyzed points plays a very important role in preventing the penetration of halogens and other substances. Incidentally, the depth of the line analysis portion where the palladium-concentrated bonding region was observed (the width in the depth direction) illustrated in Table 4 was 50 nm or more at the both points.

Further, the occupancy ratio of the palladium-concentrated bonding region was found by the above-described method. That is, the cut surface was observed by a surface analysis with an electron probe microanalyzer (EPMA) (an acceleration voltage of 15 kV, a current value of 290 nA), the palladium-concentrated bonding region was identified according to the intensity difference of the palladium element, and the total of widths of ranges with the detected palladium-concentrated bonding region was set as the total width $X_1$. The occupancy ratio (($X_1/X_0$)×100(%)) was calculated by using the maximum width $X_0$ of the second ball compressed portion 20b at the bonding surface and the above-described total width $X_1$. Further, as a result of line-analyzing the point with the lowest intensity of palladium near the bonding surface 21 (the lightest colored portion in the image) in the EPMA surface analysis using FE-SEM/EDX, the concentration of palladium was confirmed to be 2.0 mass % or more relative to the total of aluminum, copper, and palladium. That is, it is clear that all the regions calculated as the occupancy ratio are the palladium-concentrated bonding region.

Figure 8:
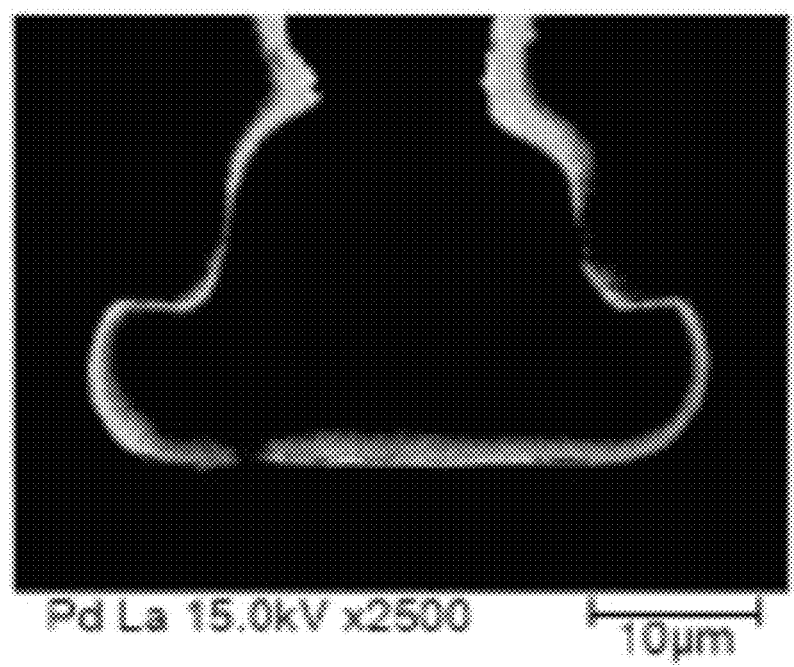
FIG. 8 is an electron probe microanalyzer (EPMA) image of the bonding structure in the example.
Figure 9:
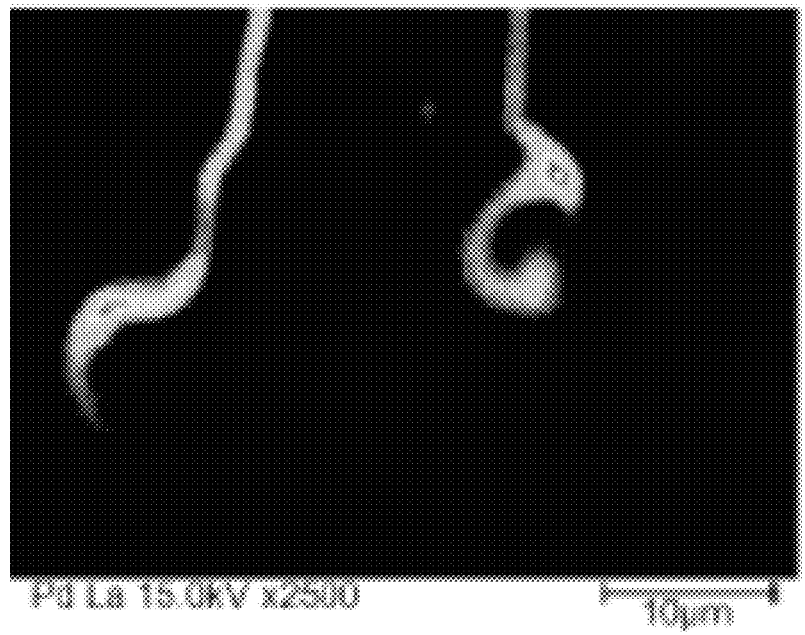
FIG. 9 is an EPMA image of a bonding structure with no presence of palladium near a bonding surface.

Similarly, bonding structures of the palladium-coated copper wires with the compositions in the comparative examples of Examples 24 to 29 were also evaluated in the same manner as above. Results are illustrated in Table 5. Incidentally, Examples 30, 31, and 32 were classified as nonconforming products due to a large shrinkage cavity observed in the evaluation of shrinkage cavity in the free air ball, resulting in that subsequent evaluations were not performed thereon. In Examples 24 to 29, the concentration of palladium relative to the total of aluminum, copper, and palladium in each of the line analysis portions was less than 2.0 mass %. Further, Tables 4 and 5 illustrate the free air ball forming conditions in the respective examples illustrated in Tables 1 and 2, together with the results of the HAST and HTS reliability evaluations. FIG. 8 illustrates an EPMA image of the bonding structure in Example 19, and FIG. 9 illustrates an EPMA image of the bonding structure with no presence of palladium near the bonding surface. Incidentally, the EPMA images can actually be acquired as color photographs.

TABLE 4

| | | Pd-coated Cu bonding wire | | | | | | Evaluation | | | | |
| | | | | Concentration | | | | | | | | |
| | | | Concentration | of sulfur | | | Free air ball | | Pd-concentrated bonding region | | | |
| | | Gold | of Pd (derived | group element | | | Arc | Diameter | | | | |
| | Diameter | layer | from Pd layer) | in entire wire | | | discharge | of | | Occupancy | HAST | |
| | of wire | thickness | in entire wire | (mass ppm) | | | current | ball | Present ○ | ratio | 400 600 | Overall |
| Example | (μm) | (μm) | (mass %) | S | Se | Te | value (mA) | (μm) | Absent x | (%) | hrs hrs HTS | evaluation |
| Example 1 | 18 | — | 1.2 | 7 | — | — | 65 | 33 | ○ | 30 | ⊚ ⊚ ⊚ | ⊚ |
| 2 | 18 | — | 1.2 | 7 | — | — | 30 | 30 | ○ | 40 | ⊚ ⊚ ⊚ | ⊚ |
| 3 | 18 | — | 1.2 | 7 | — | — | 90 | 36 | ○ | 35 | ⊚ ⊚ ⊚ | ⊚ |
| 4 | 18 | — | 1.5 | — | 8 | — | 65 | 27 | ○ | 40 | ⊚ ⊚ ⊚ | ⊚ |
| 5 | 25 | — | 1.5 | — | 8 | — | 90 | 40 | ○ | 35 | ⊚ ⊚ ⊚ | ⊚ |
| 6 | 25 | — | 1.5 | — | 8 | — | 65 | 45 | ○ | 65 | ⊚ ⊚ ⊚ | ⊚ |
| 7 | 18 | — | 2.0 | — | — | 18 | 65 | 38 | ○ | 70 | ⊚ ⊚ ⊚ | ⊚ |

TABLE 4-continued

| | | | Pd-coated Cu bonding wire | | | | | | | | | | |
|---|---|---|---|---|---|---|---|---|---|---|---|---|---|
| | | | | Concentration of sulfur group element in entire wire (mass ppm) | | | Free air ball | | Pd-concentrated bonding region | | Evaluation | | |
| | | Gold | Concentration of Pd (derived from Pd layer) in entire wire (mass %) | | | | Arc discharge current value (mA) | Diameter of ball (μm) | | | HAST | | |
| | Diameter of wire (μm) | layer thickness (μm) | | | | | | | Present ○ Absent × | Occupancy ratio (%) | 400 hrs | 600 hrs HTS | Overall evaluation |
| Example | | | | S | Se | Te | | | | | | | |
| 8 | 25 | — | 2.0 | — | — | 19 | 30 | 50 | ○ | 75 | ◎ | ◎ ◎ | ◎ |
| 9 | 18 | — | 2.3 | 11 | — | — | 65 | 34 | ○ | 80 | ◎ | ◎ ◎ | ◎ |
| 10 | 25 | — | (X) 3.6 (2.3) | 11 | — | — | 30 | 45 | ○ | 55 | ◎ | ◎ ◎ | ◎ |
| 11 | 18 | — | 1.3 | — | 18 | — | 65 | 37 | ○ | 50 | ◎ | ◎ ◎ | ◎ |
| 12 | 18 | — | 1.3 | — | 18 | — | 30 | 30 | ○ | 70 | ◎ | ◎ ◎ | ◎ |
| 13 | 18 | — | 1.6 | — | — | 48 | 65 | 28 | ○ | 70 | ◎ | ◎ ◎ | ◎ |
| 14 | 18 | — | 1.6 | — | — | 48 | 90 | 35 | ○ | 75 | ◎ | ◎ ◎ | ◎ |
| 15 | 18 | — | 2.1 | 7 | 6 | — | 65 | 32 | ○ | 80 | ◎ | ◎ ◎ | ◎ |
| 16 | 18 | — | 2.1 | 7 | 6 | — | 90 | 34 | ○ | 85 | ◎ | ◎ ◎ | ◎ |
| 17 | 18 | — | 2.2 | — | 13 | 24 | 65 | 36 | ○ | 85 | ◎ | ◎ ◎ | ◎ |
| 18 | 25 | — | 2.2 | — | 13 | 24 | 30 | 42 | ○ | 100 | ◎ | ◎ ◎ | ◎ |
| 19 | 18 | — | 2.4 | 6 | 7 | 15 | 65 | 29 | ○ | 95 | ◎ | ◎ ◎ | ◎ |
| 33 | 18 | 2 | 1.2 | 7 | — | — | 90 | 35 | ○ | 30 | ◎ | ◎ ◎ | ◎ |
| 34 | 18 | 4 | 1.5 | — | 8 | — | 65 | 40 | ○ | 35 | ◎ | ◎ ◎ | ◎ |
| 35 | 18 | 6 | 2.0 | — | — | 18 | 30 | 42 | ○ | 50 | ◎ | ◎ ◎ | ◎ |

TABLE 5

| | | | Pd-coated Cu bonding wire 評価 | | | | | | | | | | |
|---|---|---|---|---|---|---|---|---|---|---|---|---|---|
| | | | | Concentration of sulfer group element in entire wire (mass ppm) | | | Free air ball | | Pd-concentrated bonding region | | | | |
| | | Gold layer thickness (μm) | Concentration of Pd (derived from Pd layer) in entire wire (mass %) | | | | Arc discharge current value (mA) | Diameter of ball (μm) | Present ○ Absent × | Occupancy ratio (%) | HAST | | |
| Example | Diameter of wire (μm) | | | S | Se | Te | | | | | 400 hrs | 600 hrs HTS | Overall evaluation |
| CE 24 | 18 | — | 1.3 | — | — | 12 | 65 | 28 | × | 0 | ◎ | × (4) × (6) | × |
| 25 | 18 | — | 1.3 | — | — | 12 | 90 | 34 | × | 0 | ◎ | × (6) × (6) | × |
| 26 | 18 | — | 1.6 | — | — | 10 | 65 | 37 | × | 0 | ◎ | × (3) × (6) | × |
| 27 | 25 | — | 1.6 | — | — | 10 | 65 | 47 | × | 0 | ◎ | × (6) × (8) | × |
| 28 | 18 | — | 1.6 | 2 | 3 | 3 | 65 | 29 | × | 0 | ◎ | × (8) × (10) | × |
| 29 | 18 | — | 0.8 | 6 | 18 | — | 65 | 35 | × | 0 | ◎ | × (7) × (12) | × |

Next, the palladium-coated copper bonding wire in a predetermined example was evaluated for chip damage and the HAST test, in which the set temperature was increased by 5° C. to set severe specifications at 135° C. for 600 hours. Chip damage performance was evaluated by performing ball bonding using the palladium-coated copper bonding wire obtained in each of the examples under the same conditions as above, and observing the substrate directly under the ball bonding portion with an optical microscope. One hundred ball bonding portions were observed. Example 19 was marked as good (o) because there was one small crack that did not cause any particular problem in use. The other examples were marked as excellent (◎) because no cracks occurred at all. In the HAST test with severe specifications, as in the normal HAST test, the example in which the electrical resistance value after the test was less than 1.1 times the value before the test was evaluated as ◎, and the example in which the electrical resistance value after the test was 1.1 times or more and 1.2 times or less the value before the test was evaluated as o. Incidentally, in Example 1, in five of the 500 circuits, the electrical resistance value after the test was 1.1 times or more and 1.2 times or less the value before the test, but in the other circuits, the electrical resistance value after the test was less than 1.1 times the value before the test. Further, as an overall evaluation, the example in which the result of the chip damage evaluation and the result of the HAST test with severe specifications are both ◎ was evaluated as ◎, and the example in which one of them is o and the other of them is ◎ was evaluated as o. Results are illustrated in Table 6.

TABLE 6

| | Pd-coated Cu bonding wire | | | | | | | |
|---|---|---|---|---|---|---|---|---|
| | Concentration of Pd in entire wire | Concentration of sulfur group element in entire wire (mass ppm) | | | Concentration of Pd of surface of FAB | Evaluation | | |
| Example | (mass %) | S | Se | Te | (atom %) | Chip damage | HAST (severe specifications) | Overall evaluation |
| Example 1 | 1.2 | 7 | — | — | 6.7 | ◎ | ○ | ○ |
| 4 | 1.5 | — | 8 | — | 7.2 | ◎ | ◎ | ◎ |
| 7 | 2.0 | — | — | 18 | 12.0 | ◎ | ◎ | ◎ |
| 9 | 2.3 | 11 | — | — | 20.0 | ◎ | ◎ | ◎ |
| 11 | 1.3 | — | 18 | — | 11.0 | ◎ | ◎ | ◎ |
| 13 | 1.6 | — | — | 48 | 13.0 | ◎ | ◎ | ◎ |
| 15 | 2.1 | 7 | 6 | — | 16.0 | ◎ | ◎ | ◎ |
| 17 | 2.2 | — | 13 | 24 | 23.0 | ◎ | ◎ | ◎ |
| 19 | 2.4 | 6 | 7 | 15 | 28.0 | ○ | ◎ | ○ |

Table 6 reveals that Examples 1, 4, 7, and 9 where the concentration of palladium of the surface of the tip portion of the free air ball (palladium-concentrated region) was 7.0 atom % or more were able to withstand even the HAST test performed under the conditions more severe than usual, where the temperature was set to 135° C. It reveals that Example 1 where the concentration of palladium of the surface of the tip portion of the free air ball was 6.7 atom % had some of the resistance values that were 1.1 times or more and 1.2 times or less after the test, which was slightly inferior to the examples where the concentration of palladium of the palladium-concentrated region was 7.2 atom % or more. Further, in the examples where the concentration of palladium of the surface of the tip portion of the free air ball was 23.0 atom % or less, no chip damage occurred, while in Example 19 where the concentration was greater than 23.0 atom %, a small amount of chip damage occurred, which did not cause any problem. These reveal that the concentration of palladium of the surface of the free air ball is preferably 7.0 atom % or more and 25.0 atom % or less. The palladium-coated copper bonding wire with the concentration of palladium of the surface of the free air ball being 7.0 atom % or more and 25.0 atom % or less is suitable for devices for automobile use and also enables an improvement in yield.

What is claimed is:

1. A wire bonding structure, comprising: an aluminum-containing electrode of a semiconductor chip; a bonding wire; and a ball bonding portion between the electrode and the bonding wire, wherein
the bonding wire is a palladium-coated copper bonding wire including: a core material containing copper as a main component; and a palladium layer on the core material and containing a sulfur group element, the palladium-coated copper bonding wire in which with respect to a total of copper, palladium, and the sulfur group element, a concentration of palladium is 1.0 mass % or more and 4.0 mass % or less and a total concentration of the sulfur group element is 50 mass ppm or less, and a concentration of sulfur is 5 mass ppm or more and 12 mass ppm or less, a concentration of selenium is 5 mass ppm or more and 20 mass ppm or less, or a concentration of tellurium is 15 mass ppm or more and 50 mass ppm or less, and
the wire bonding structure includes a palladium-concentrated bonding region with the concentration of palladium being 2.0 mass % or more relative to a total of aluminum, copper, and palladium near a bonding surface of the electrode and the ball bonding portion.

2. The wire bonding structure according to claim 1, wherein
the palladium-concentrated bonding region is present on lines parallel to a wire longitudinal direction, the lines each passing through a position at a at least distance of one-eighth of the maximum width of the ball bonding in a direction vertical to the wire longitudinal direction from each of both ends.

3. The wire bonding structure according to claim 1, wherein
an occupancy ratio of the palladium-concentrated bonding region near the bonding surface is 25% or more.

4. A palladium-coated copper bonding wire, comprising:
a core material containing copper as a main component; and
a palladium layer on the core material,
the palladium-coated copper bonding wire containing a sulfur group element, wherein
with respect to the total of copper, palladium, and the sulfur group element of the palladium-coated copper bonding wire, a concentration of palladium is 1.0 mass % or more and 4.0 mass % or less and a total concentration of the sulfur group element is 50 mass ppm or less, and a concentration of sulfur is 5 mass ppm or more and 12 mass ppm or less, a concentration of selenium is 5 mass ppm or more and 20 mass ppm or less, or a concentration of tellurium is 15 mass ppm or more and 50 mass ppm or less, and
when the palladium-coated copper bonding wire is ball bonded onto an aluminum electrode to fabricate a wire bonding structure, a palladium-concentrated bonding region with the concentration of palladium being 2.0 mass % or more relative to a total of aluminum, palladium, and copper is formed near a bonding surface of the ball bonding on the aluminum electrode.

5. The palladium-coated copper bonding wire according to claim 4, wherein
an occupancy ratio of the palladium-concentrated bonding region near the bonding surface is 25% or more.

6. A semiconductor device, comprising:
a semiconductor chip;
an aluminum-containing aluminum electrode provided on the semiconductor chip;

a gold-coated or silver-coated external electrode provided outside the semiconductor chip; and a bonding wire connecting the aluminum electrode and a surface of the external electrode, wherein the bonding wire is made of a palladium-coated copper wire, and the semiconductor device includes the wire bonding structure according to claim 1 near a bonding surface of the aluminum electrode and the bonding wire.

7. A semiconductor device, comprising:

a semiconductor chip;

an aluminum-containing aluminum electrode provided on the semiconductor chip;

a gold-coated or silver-coated external electrode provided outside the semiconductor chip; and a bonding wire connecting the aluminum electrode and a surface of the external electrode, wherein the bonding wire is made of the palladium-coated copper bonding wire according to claim 4.

8. The semiconductor device according to claim 6 that is QFP (Quad Flat Packaging).

9. The semiconductor device according to claim 6 that is BGA (Ball Grid Array).

10. The semiconductor device according to claim 6 that is QFN (Quad For Non-Lead Packaging).

11. The semiconductor device according to claim 6 that is for automotive applications.

12. A manufacturing method of a semiconductor device, the semiconductor device comprising:

a semiconductor chip;

an aluminum-containing aluminum electrode provided on the semiconductor chip;

a gold-coated or silver-coated external electrode provided outside the semiconductor chip; and a bonding wire connecting the aluminum electrode and a surface of the external electrode, in which the bonding wire is made of a palladium-coated copper bonding wire including: a core material containing copper as a main component; and a palladium layer on the core material and containing a sulfur group element, the palladium-coated copper bonding wire in which with respect to a total of copper, palladium, and the sulfur group element of the palladium-coated copper bonding wire, a concentration of palladium is 1.0 mass % or more and 4.0 mass % or less and a total concentration of the sulfur group element is 5 mass ppm or more and 50 mass ppm or less, the manufacturing method comprising:

forming a free air ball at a tip of the palladium-coated copper bonding wire and ball bonding the palladium-coated copper bonding wire to the aluminum electrode via the free air ball, and thereby, forming, near a bonding surface of the ball bonding on the electrode, a wire bonding structure including a palladium-concentrated bonding region with the concentration of palladium being 2.0 mass % or more relative to the total of aluminum, copper, and palladium;

and thereafter, second bonding a portion of the palladium-coated copper bonding wire apart from the free air ball by the length of the bonding wire to the surface of the external electrode.

13. The manufacturing method of the semiconductor device according to claim 12, wherein an occupancy ratio of the palladium-concentrated bonding region near the bonding surface to the maximum width of the ball bonding portion in a parallel direction is 25% or more.

\* \* \* \* \*